(12) United States Patent
Hughes

(10) Patent No.: US 9,204,547 B2
(45) Date of Patent: Dec. 1, 2015

(54) NON-PLANAR PRINTED CIRCUIT BOARD WITH EMBEDDED ELECTRONIC COMPONENTS

(71) Applicant: United States of America as Represented by the Secratary of the Army, Washington, DC (US)

(72) Inventor: Bruce V. Hughes, Falkville, AL (US)

(73) Assignee: The United States of America as represented by the Secratary of the Army, Washington, DC (US)

( * ) Notice: Subject to any disclaimer, the term of this patent is extended or adjusted under 35 U.S.C. 154(b) by 217 days.

(21) Appl. No.: 13/864,656

(22) Filed: Apr. 17, 2013

(65) Prior Publication Data

US 2014/0313684 A1    Oct. 23, 2014

(51) Int. Cl.
| H05K 1/11 | (2006.01) |
| H05K 1/02 | (2006.01) |
| H05K 3/00 | (2006.01) |
| H05K 3/46 | (2006.01) |
| H05K 1/18 | (2006.01) |

(52) U.S. Cl.
CPC ............ *H05K 1/119* (2013.01); *H05K 1/0284* (2013.01); *H05K 3/0014* (2013.01); *H05K 3/4682* (2013.01); *H05K 1/186* (2013.01); *H05K 2201/056* (2013.01); *H05K 2201/09018* (2013.01); *H05K 2201/10583* (2013.01); *Y10T 29/49155* (2015.01)

(58) Field of Classification Search
None
See application file for complete search history.

(56) References Cited

U.S. PATENT DOCUMENTS

| 3,039,177 | A | * | 6/1962 | Burdett ........................... 29/848 |
| 4,833,568 | A | * | 5/1989 | Berhold ........................ 361/690 |
| 4,986,870 | A |   | 1/1991 | Frohlich |
| 7,886,433 | B2 |  | 2/2011 | Bae et al. |
| 8,161,633 | B2 |  | 4/2012 | Shacklette et al. |
| 2002/0144397 | A1 | | 10/2002 | Morris |
| 2003/0177634 | A1 | | 9/2003 | Morris |
| 2004/0037079 | A1 | * | 2/2004 | Luk ................................ 362/252 |
| 2005/0275088 | A1 | * | 12/2005 | Sakurai et al. ................ 257/723 |
| 2009/0071705 | A1 | | 3/2009 | Kim et al. |
| 2009/0277673 | A1 | | 11/2009 | Sohn et al. |
| 2011/0100689 | A1 | | 5/2011 | Byun et al. |

* cited by examiner

*Primary Examiner* — Dion R Ferguson
(74) *Attorney, Agent, or Firm* — Michael K. Gray

(57) ABSTRACT

A non-planar printed circuit board has an interior surface and an exterior surface. Between the interior surface and exterior surfaces are layers of conductive and dielectric materials. Passive and active electrical components are embedded within the interior and exterior surfaces. A hollow region is defined by the interior surface of the non-planar circuit board. The non-planar printed circuit board is manufactured on a mandrel having a non-planar shape such as, for example, a cylinder or sphere so as to form a hollow, curved non-planar structure.

20 Claims, 30 Drawing Sheets

STEP 15
Coat the copper foil with appropriate etch resist material similar to traditional 2D planar PCB fabrication

STEP 16
Apply and register the appropriate artwork over the resist coated copper foil and secure with removable tooling pins as required

STEP 17
UV expose the entire assembly only curing the areas not masked by the artwork similar to traditional 2D planar PCB fabrication

STEP 18
Remove the artwork tool similar to traditional 2D planar PCB fabrication

STEP 19
Submerge or subject the entire mandrel and newly constructed substrate to a developing process which removes the uncured areas of the coat resist similar to traditional 2D planar PCB fabrication

STEP 20
Submerge or subject the entire mandrel and newly constructed substrate to a chemical etching process which removes the uncoated areas of copper foil similar to traditional 2D planar PCB fabrication

STEP 21
Submerge or subject the entire mandrel and newly constructed substrate to a stripping process which removes the remaining cured coat resist from the remaining un-etched copper foil thus leaving the designed circuit pattern similar to traditional 2D planar PCB Go to FIG 48, Step 22

FIG. 47

NON-PLANAR PRINTED CIRCUIT BOARD WITH EMBEDDED ELECTRONIC COMPONENTS

The invention described herein may be manufactured, used and licensed by or for the U.S. Government for U.S. Government purposes without payment of any royalties thereon.

BACKGROUND OF THE INVENTION

1. Field of the Invention

This invention relates generally to the field of electronic printed circuit boards (PCBs) and more specifically to a non-planar circuit board having embedded components.

2. Discussion of the Background

Traditional PCB manufacturing technology involves sequentially laminating multiple conductive layers (typically made of copper) with dielectric laminate such that the dielectric laminate is positioned between the copper conductive layers. These layers of copper and dielectric laminate are typically stacked one atop another so as to form a solid square, solid rectangular or disk-shaped circuit board. In the traditional method, complex circuit patterns are formed from the copper layers by a subtractive or additive process performed during each lamination step. The copper circuit layers are connected by drilling vias through the respective layers and filling the vias with plating to form conductive paths between the layers.

Planar PCBs can be fabricated with both passive and active electrical components embedded within the internal layers of the PCB. The term "planar" as used with traditional PCBs pertains to the flat or level nature of such PCBs or at least to the substantially two-dimensional characteristics of such solid circuit boards. Traditional printed circuit boards (PCBs) are often stacked on mounting racks or frames within a given device and are prone to taking up a large percentage of space within the given device.

SUMMARY OF THE INVENTION

In the present invention a printed circuit board is manufactured with a mandrel. The circuit board has a hollow center region with an interior surface of the circuit board taking the shape of the mandrel. The mandrel used to manufacture the non-planar printed circuit board of the present invention has a predetermined geometric shape such that the outer surface of the mandrel defines the shape of the interior surface of the circuit board.

The non-planar circuit board of the present invention has a multiple layered region having conductive layers separated by dielectric layers. The multiple layered region has an outer surface and an interior surface with conductive and dielectric layers being positioned between the outer surface and interior surface. A hollow region is defined by the interior surface of the multiple layered region. Electrical components are embedded within the various layers of the circuit board. The embedded electrical components can be passive or active components.

DESCRIPTION OF THE DRAWINGS

A more complete appreciation of the invention and many of the attendant advantages thereof will be readily obtained by reference to the following detailed description when considered in connection with the accompanying drawings.

FIGS. 45-50 are flow charts of the steps conducted for making a hollow PCB in accordance with the present invention.

DETAILED DESCRIPTION

Figure 1:
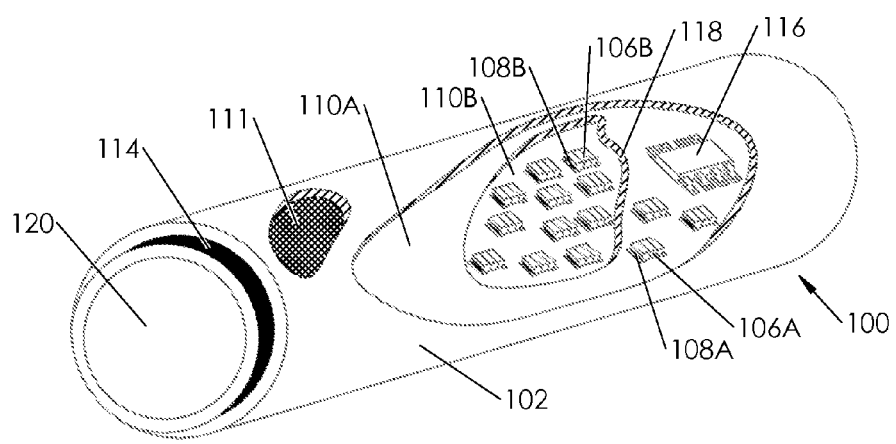
FIG. 1 is a perspective, partial X-ray view of hollow PCB in accordance with the present invention.

With reference to FIG. 1, a hollow circuit board 100 in accordance with the present invention has an outer surface 102. Circuit board 100 is cylindrical in shape; however the present invention is not limited to cylindrical shapes. The outer surface 102 can be made of a variety of materials, including dielectric laminate or metal foil, depending upon the purpose for which the circuit board 100 is used. Embedded electrical components such as components 106A and 106B rest upon a dielectric laminate layer 110B. Ply layers, such as ply layer 111 can be situated between dielectric layers.

Embedded passive electrical devices such as resistors, capacitors, inductors or discretely formed resistors, capacitors and inductors, as represented by components 106A and 106B, may be formed on the ply layers. Techniques such as the Zycon Buried Capacitance (ZBC) technique may be used to form capacitors and nickel phosphorus may be used to form resistors as are known in the art. Additional processes, such as laser trimming and chemical etching, identical to those used in traditional 2D PCB fabrication methods would be required to form the resistive, capacitive and inductive patterns once the material is applied.

Components 106A and 106B are connected to a conductive layer (not shown) by lands 108A and 108B, respectively. Active electrical component 116 rests upon a dielectric laminate layer 110A. Conductive vias (not shown) connect electrical component 116 with conductive layer 118.

The circuit board 100 has a hollow center or hollow center region 120. The hollow circuit board 100 can include a step or lip 114 which can be used as a connection tool. The step or lip 114 may be fabricated through the use of sequential lamination and Computer Numerical Control (CNC) routing. The cylindrical circuit board 100 can be understood as being a layered shell with a hole or hollow center region 120 extending lengthwise through its center.

Figure 2:
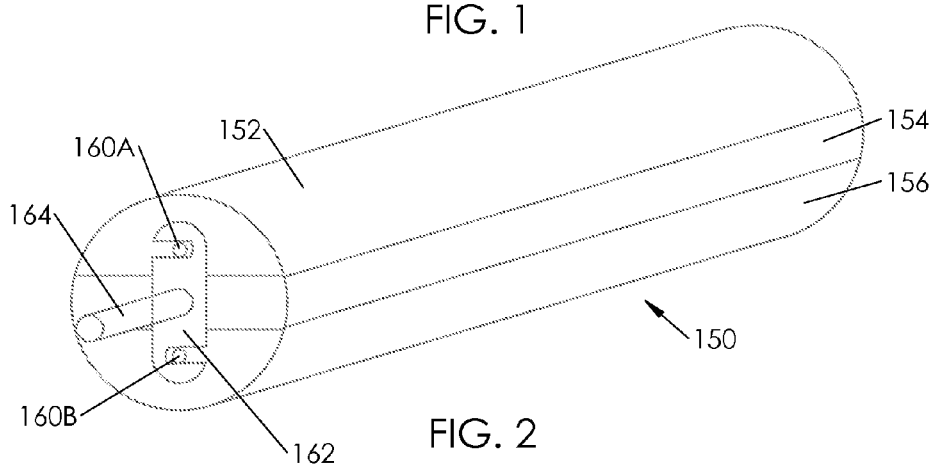
FIG. 2 is a perspective view of a mandrel for making a hollow PCB in accordance with the present invention.

With reference to FIG. 2, a mandrel 150 has a top piece 152, a middle piece 154 and a bottom piece 156 which are held together by a swivel latch 162 which secures to pins 160A and 160B for purposes of holding the mandrel together. An index pin 164 extends through the swivel latch. An index pin and a swivel latch (not shown in FIG. 2) are provided at the opposite end of mandrel 150. Index pins are used to index or rotate the mandrel 150 in a controlled manner. In FIG. 2, the outside diameter of the mandrel 150 establishes the internal diameter of the cylindrical PCB to be fabricated. The length of the mandrel 150 may be used to determine how many distinct PCB's can be built simultaneously.

The mandrel length is comparable to the panel size used in traditional PCB fabrication. However, the number of distinct PCB's per mandrel may ultimately be limited to the "breakaway" force required to remove the completed PCB or PCB's from the mandrel. This mandrel may be constructed out of various materials; however, one material that is particularly well suited is Titanium due to its durability and resistance to various plating baths.

The mandrel may have a network of shallow channels machined into its surface to facilitate the vacuum lamination process and to provide clearance for a router bit if it is desired to separate the constructed PCB into separate panels.

Figure 3:
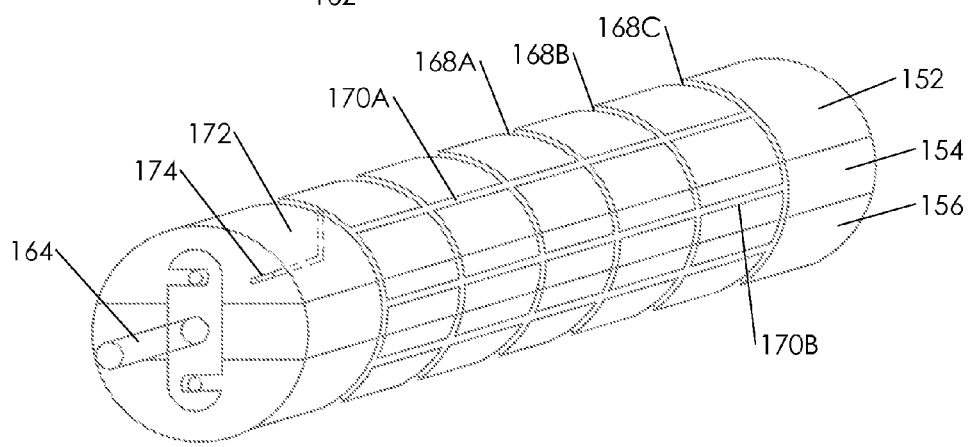
FIG. 3 is a perspective view of a mandrel for making a hollow PCB in accordance with the present invention, with the mandrel having surface channels to aid lamination and facilitate the routing process.

In FIG. 3, lateral channels, such as lateral channels 168A, 168B, 168C, connect to horizontal channels, such as horizontal channels 170A and 170B. The lateral and horizontal channels form recesses in the outer surfaces of the top section 152, middle section 154 and lower section 156 of mandrel 150. In the example given, a vacuum hook-up pipe 174 connects to passageway 172 located within the top portion 152 of mandrel 150. Passageway 172 is fluidly connected to the horizontal and lateral channels to allow for vacuum evacuation of the channels during the lamination processes used in the manufacturing the present invention. (It is understood that the mandrel 150 in the various drawing figures can include lateral and horizontal channels even if not shown in the figures).

Figure 4:
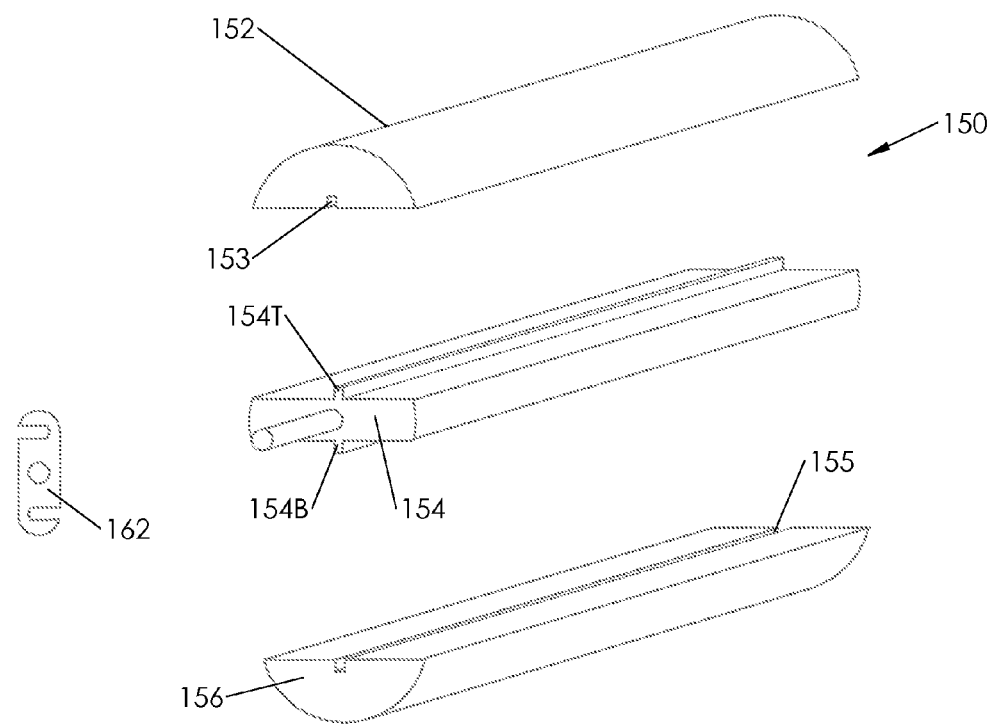
FIG. 4 is an exploded view of the mandrel for making a hollow PCB in accordance with the present invention.

In FIG. 4, the exploded view demonstrates that the center section 154 of mandrel 150 is provided with a top ridge 154T and a bottom ridge 154B for purposes of connecting to channel 153 located in the top section 152 and for connecting to channel 155 in the bottom section 156, respectively.

The mandrel or assembly tool 150 may be designed as a multiple part mandrel about which all additional materials and processes will be assembled and performed. The mandrel is designed in such a way that it can be assembled, disassembled, rotated or indexed, and held while submersed into various chemical etchant, stripping and plating baths. Further the mandrel must be capable of withstanding lamination pressure, and, as has been mentioned, may have channels machined into its outer surface to facilitate the vacuum lamination processes. Still further, the mandrel must be durable enough so as to be re-used multiple times in production.

The processes described herein and visualized in the drawing figures may be utilized in whole or in part in the manufacture of a given PCB. The number of manufacturing steps utilized is dependent upon the specific design of a given PCB and the number of layers in its construction. Multiple wrappings of conductive, dielectric and ply material may be used to form a given conductive, dielectric or ply layer so as to achieve a desired thickness of a given layer of the PCB.

Figure 5:
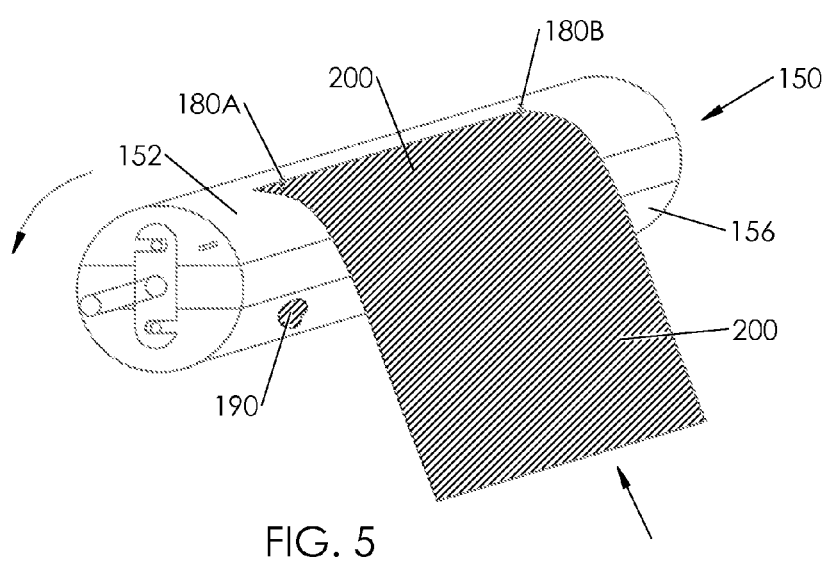
FIGS. 5-6 are pedagogical illustrations of a base conductive layer or foil being wrapped around a mandrel for purposes of assembling a hollow PCB in accordance with the present invention.

In FIG. 5, a conductive layer 200 of copper foil or other appropriate conductive material is attached to mandrel 150 by pins 180A and 180B. When manufacturing the hollow circuit board of the present invention, a release agent 190 may be applied to the surface of mandrel 150 to allow for easier release of the hollow circuit board 100 after completion of its manufacture. The mandrel in FIG. 5 is rotated so that the conductive layer is wrapped over the outer periphery of the mandrel 150. The conductive layer 200 can be a copper layer or any other appropriate conductive layer.

Figure 6:
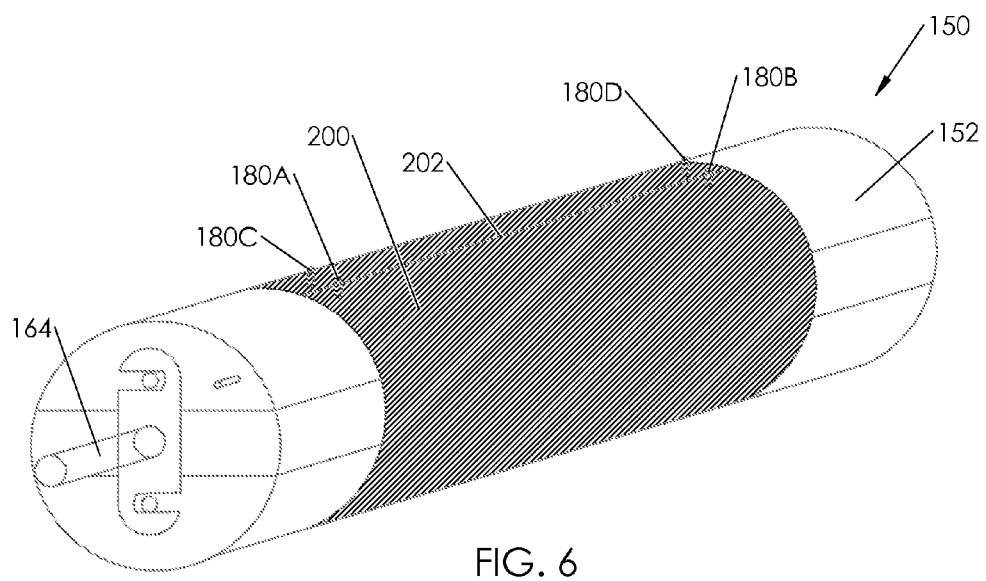

In FIG. 6, conductive layer 200 is wrapped around mandrel 150. Pins 180A, 180B, 180C and 180D secure the conductive layer so as to define a seam 202. The securing pins attach to holes in the mandrel and are removable. Pin holes are located at various locations on the mandrel to allow tooling pins to secure various layers onto the mandrel without overlapping seam locations. All layers to be assembled on the mandrel require slotted holes to be inserted over the respective securing pins. These slotted holes also allow for any circumferential movement or contraction that may occur during lamination.

Figure 7:
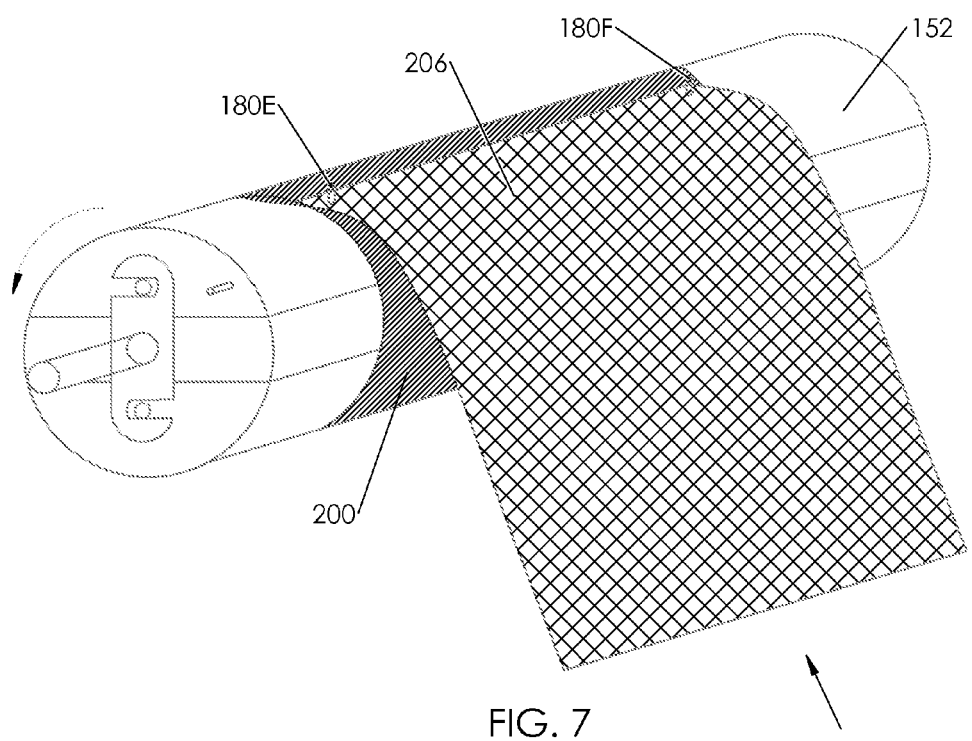
FIG. 7 is a perspective view of a first dielectric laminate layer being wrapped around the base conductive layer for purposes of assembling a non-planar PCB in accordance with the present invention.

In FIG. 7, a dielectric laminate layer 206, such as resin-filled glass or other appropriate material is attached to mandrel 150 by pins 180E and 180F. The dielectric laminate layer 206 is wrapped around the mandrel and over layer 200 and affixed to pins such that a seam is formed at a location different than seam 202 of the conductive layer 200. Layer 206 may contain a traditional semi-cured or "B" stage pre-preg laminate material or can include many types of composite filament materials. (Seams of the various conductive and dielectric layers should be staggered for purposes of structural integrity.)

Figure 8:
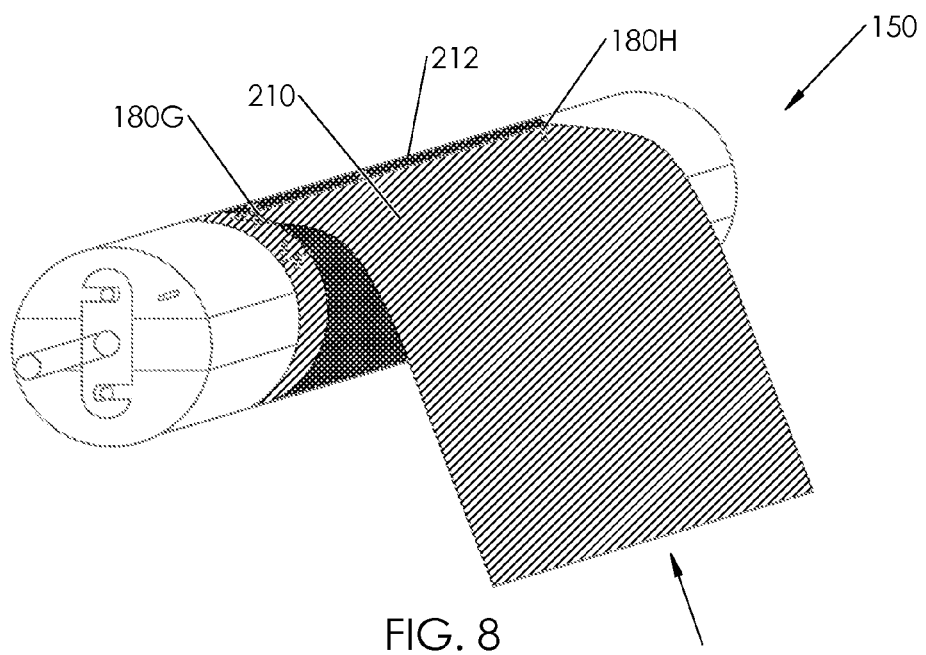
FIG. 8 is a pedagogical illustration of a second conductive layer or foil being wrapped around the first dielectric laminate layer for purposes of assembling a non-planar PCB in accordance with the present invention.

In FIG. 8, a second conductive layer 210 is attached to pins 180G and 180 H and rotated on the mandrel so as to be positioned over dielectric laminate layer 206 and the first conductive layer 200 such that dielectric laminate layer 206 is positioned between the first conductive layer 200 and the second conductive layer 210. The mandrel is rotated so that the second conductive layer 210 wraps over dielectric laminate layer 206 around the circumference of the mandrel in a manner as performed for the first conductive layer. When wrapped around dielectric laminate layer 206, the second conductive layer forms a seam 212.

Figure 9:
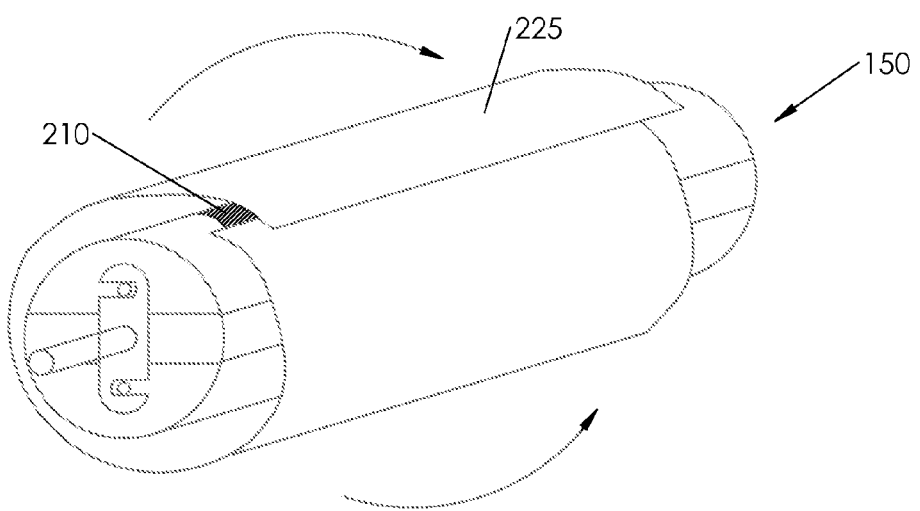
FIG. 9 is a pedagogical illustration of a smoothing wrap or sheet metal wrap being wrapped around the base conductive layer, the first dielectric laminate layer and the second conductive layer prior to a lamination process for purposes of assembling a non-planar PCB in accordance with the present invention.

In FIG. 9, the first conductive layer 200, the dielectric laminate layer 206 and the second conductive layer 210 are wrapped by a smoothing wrap 225 which can be made of stainless steel or other appropriate material for purpose of forming a smooth topography on the interacting surfaces during a lamination process.

Figure 10:
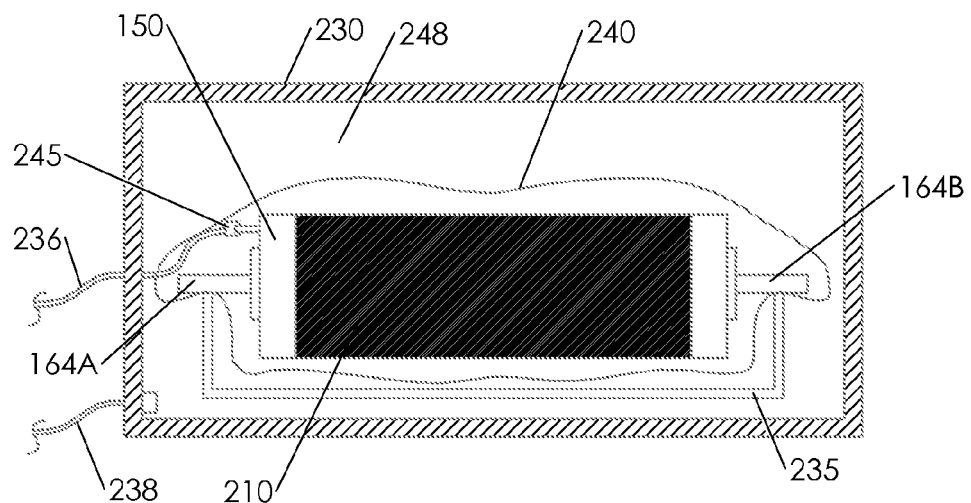
FIG. 10 is an X-ray side view of the mandrel inside a vacuum chamber for undergoing a lamination process for purposes of assembling a hollow PCB in accordance with the present invention.

In FIG. 10, the mandrel 150 is placed on a stand 235. The index pins 164A and 164B attach to the stand 235. The mandrel 150 and stand 235 are placed within a vacuum chamber 248 located in housing 230 for purposes of undergoing a lamination process. The mandrel 150 is surrounded by a vacuum bag 240.

Wrapped around the mandrel 150 and around the first conductive layer 200, the dielectric laminate layer 206 and the second conductive layer 210 is smoothing wrap 225. The mandrel 150, the first conductive layer 200, the dielectric laminate layer 206, the second conductive layer 210 and the smoothing wrap 225 are all positioned within the vacuum bag 240. A vacuum evacuation line 236 having a connector 245 is connected to pipe connection 174 which connects to the lateral and horizontal channels at the surface of mandrel 150 (FIG. 3). A positive low pressure line 238 is inserted into the chamber 248 of housing 230.

After the mandrel has been removed from vacuum chamber 248 and the smoothing wrap 225 has been removed, the completed vacuum chamber lamination process has created a solid substrate surface, i.e., the surface of conductive layer 210 which is now supported by a hardened dielectric laminate layer 206 and the underlying first conductive layer 200.

Figure 11:
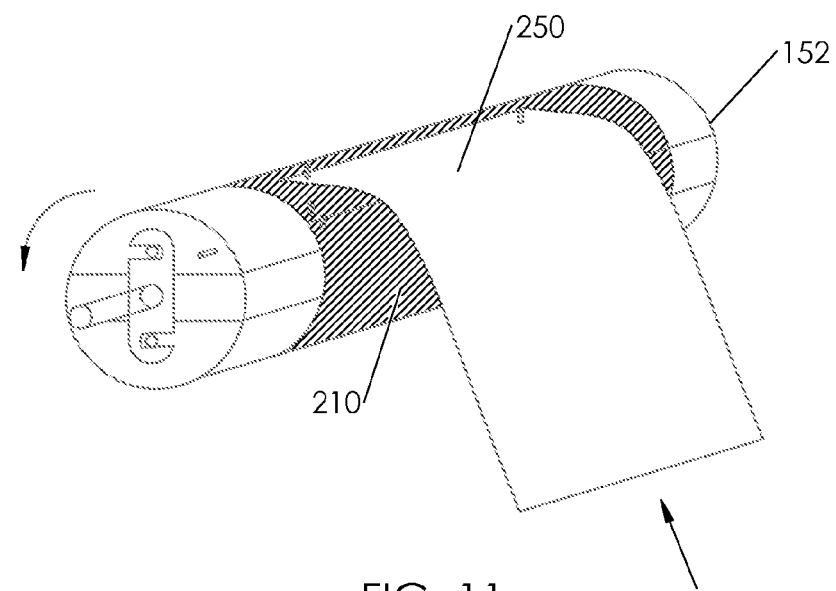
FIG. 11 is a pedagogical illustration of a photosensitive photo resist being rolled over the second conductive layer after the lamination process of FIG. 10 in accordance with the present invention.
Figure 12:
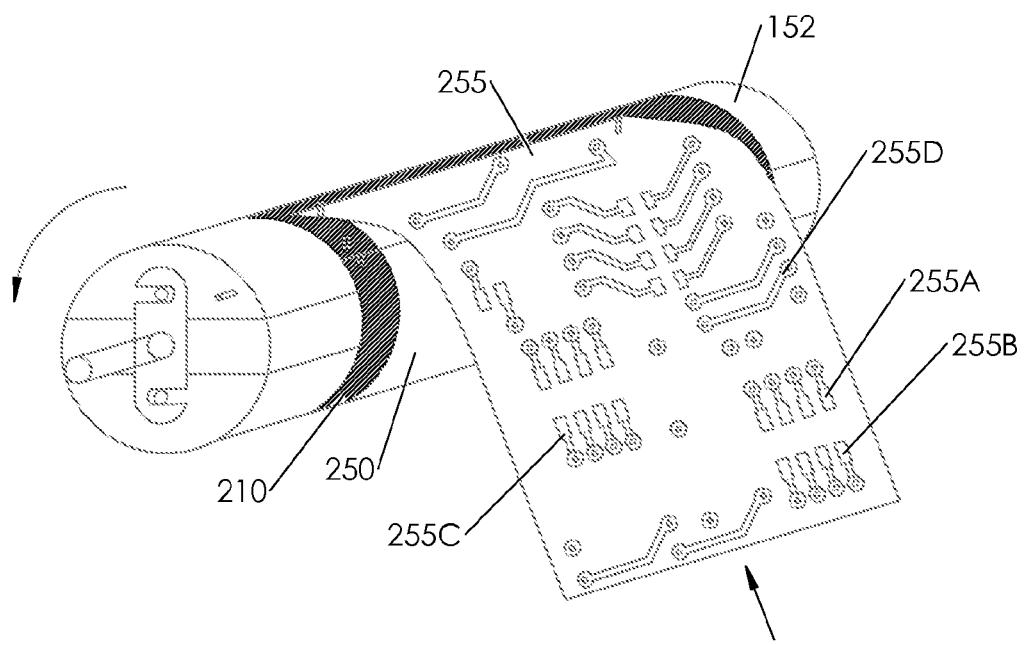
FIG. 12 is a pedagogical illustration of art work for circuitry on mylar sheet or other appropriate material being wrapped over the photo resist shown in FIG. 11 in accordance with the present invention.
Figure 13:
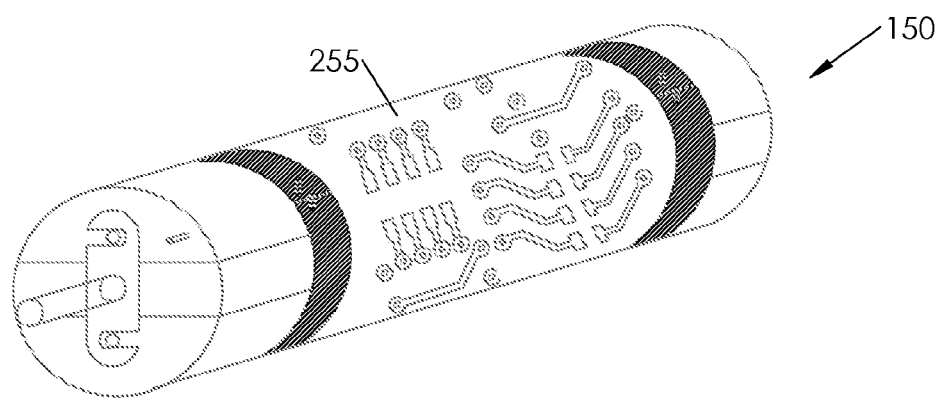
FIG. 13 is a pedagogical illustration of the art work layer shown in FIG. 12 being completely wrapped over the photo resist of FIG. 11.

In FIG. 11, photosensitive etchant resist 250 is rolled on to conductive layer 210 and rotated. An artwork or circuit design layer 255 having desired artwork, such as artwork or circuit design 255A, 255B, 255C, 255D is wrapped onto the etchant resist 250 as shown in FIG. 12. In FIG. 13 artwork layer 255 is completely wrapped around the mandrel 150.

Figure 14:
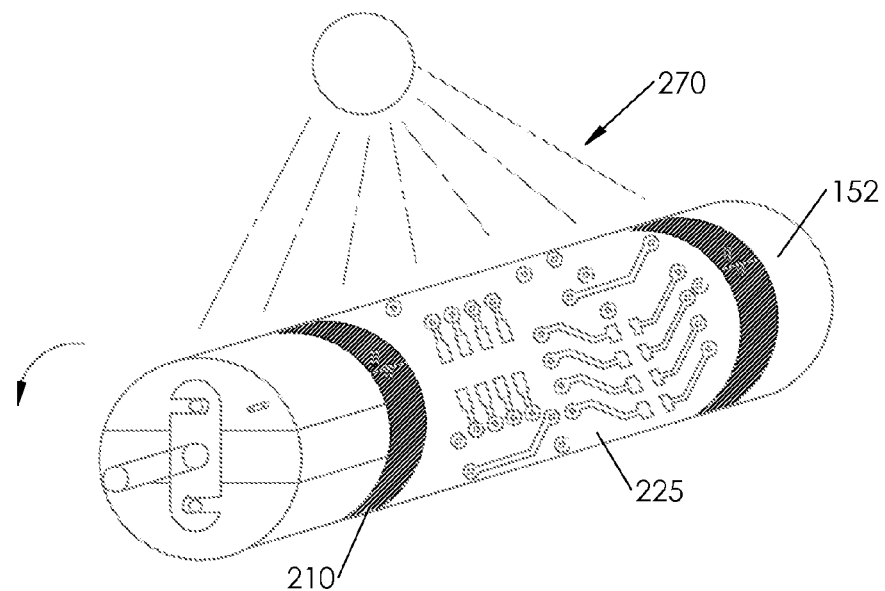
FIG. 14 is a pedagogical illustration of a UV light source traveling through the art work layer to expose and cure the photo resist layer of FIG. 11.

The circuit design layer 255 may need to be secured with one or more tooling pins to insure proper registration. Once the circuit design layer 255 is in place and registered, the etchant resist 250 is exposed and cured by UV light source 251. In FIG. 14, the light rays of UV source 270 travel through the artwork layer 255 to expose and cure the etchant resist 250. The circuit design layer 255 can be, for example, a mylar sheet having the art or circuit patterns therein. (In lieu of traditional artwork pattern definition, Laser Direct Imaging or other effective methods may also be used to define the circuit pattern.)

Figure 15:
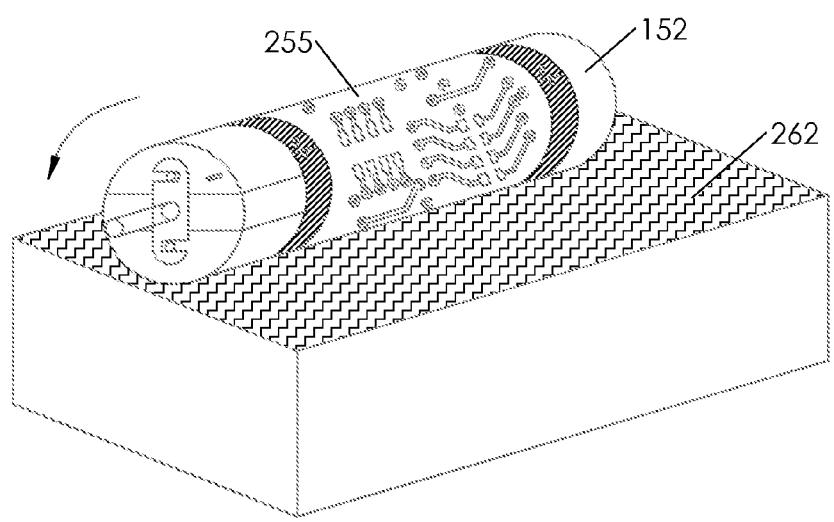
FIG. 15 is a pedagogical illustration of a development bath used in assembling a hollow PCB in accordance with the present invention.

In FIG. 15, a development bath 262 and associated processing chemically removes the uncured area of the etchant resist 250, and exposes the copper of second conductive layer 210.

Figure 15A:
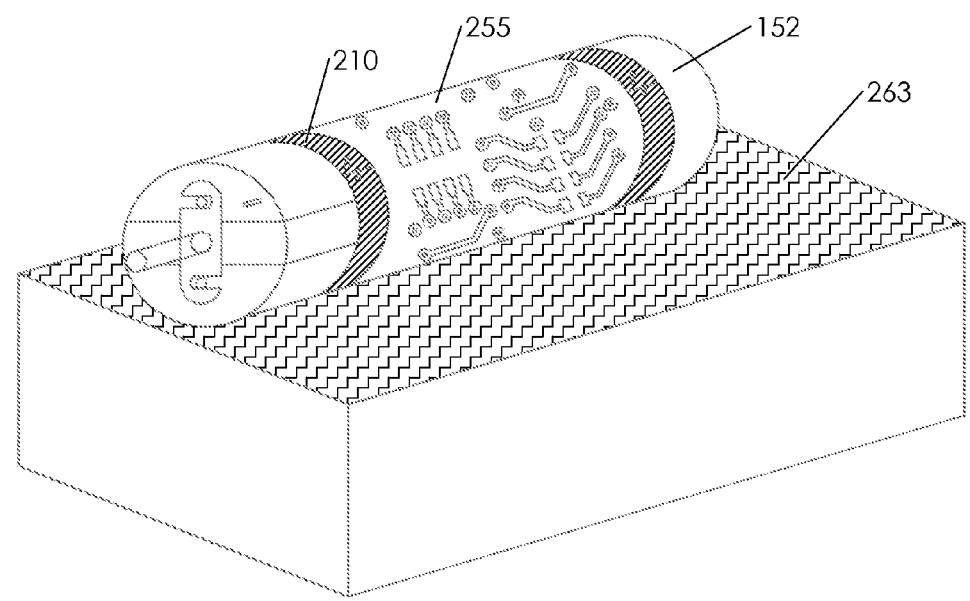
FIG. 15A is a pedagogical illustration of a non-planar PCB in accordance with the present invention undergoing a copper etching bath.

In FIG. 15A, the mandrel 150 and the non-planar PCB structure on the mandrel attached is submerged into chemical etching bath 263 which, along with associated processing, removes the exposed or un-masked copper of the copper layer 210.

Figure 16:
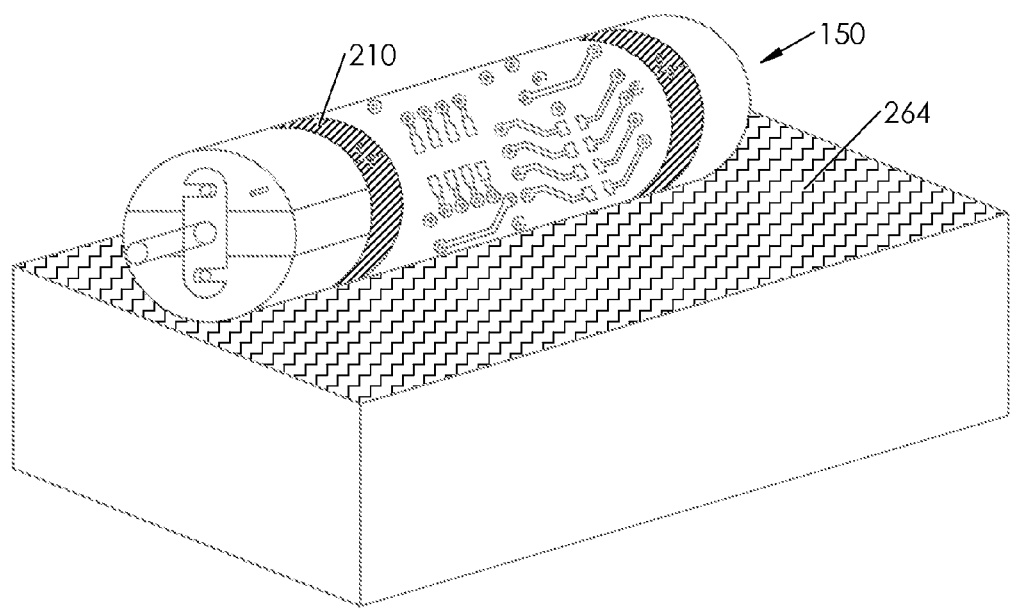
FIG. 16 is a pedagogical illustration of a chemical strip bath used in assembling a hollow PCB in accordance with the present invention.

In FIG. 16, a chemical strip bath 264 removes the cured resist on top of the regions of copper layer 210 that was not etched so as to leave a circuit pattern to which an oxide layer may be added.

Figure 17:
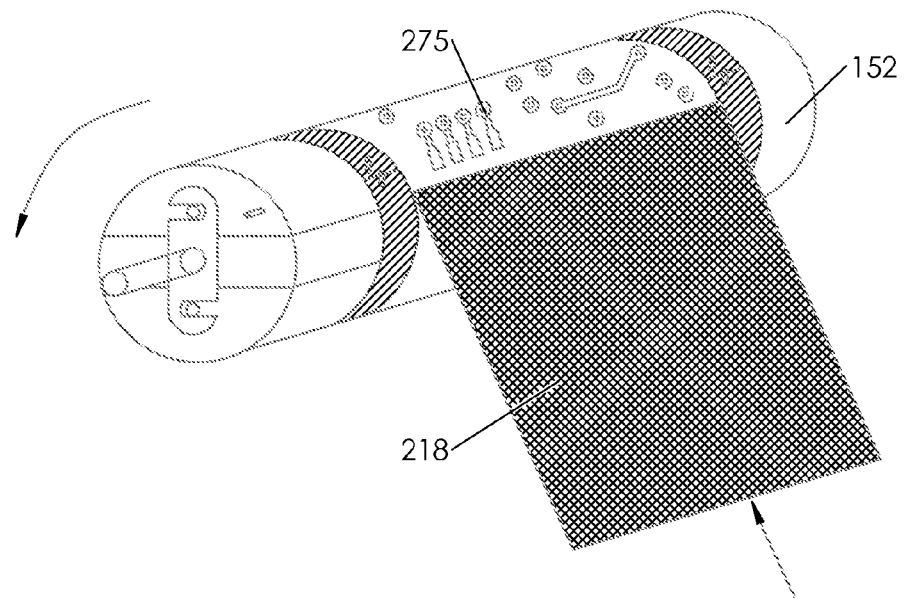
FIG. 17 is a pedagogical illustration of a second dielectric laminate layer wrapped over the circuit pattern formed from the second conductive layer in accordance with the teachings of the present invention.

In FIG. 17, a second layer of stage B pre-preg dielectric laminate material 218 is wrapped over the copper circuit patterns 275 formed from the copper conductive layer 210.

Figure 17A:
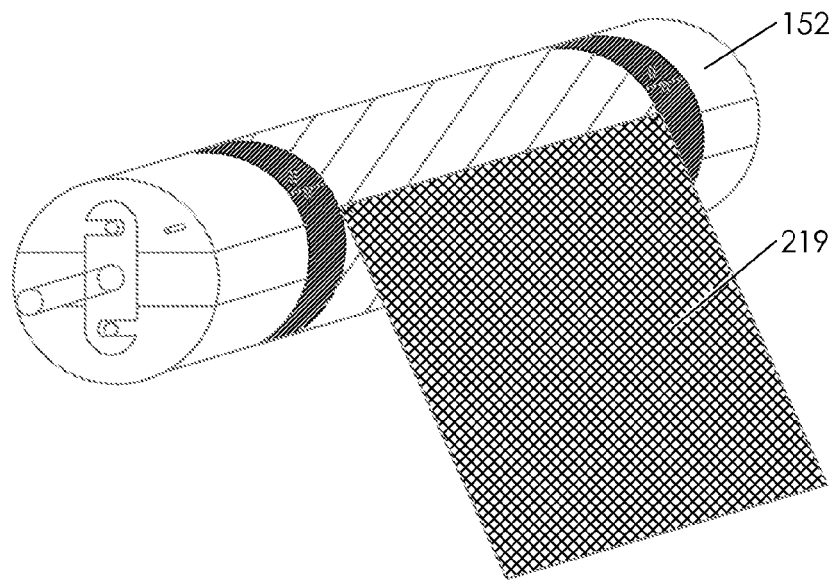
FIG. 17A is a pedagogical illustration of a ply layer being wrapped over the second dielectric laminate layer.

In FIG. 17A, a ply layer 219 is wrapped over the second dielectric layer 218.

Figure 17B:
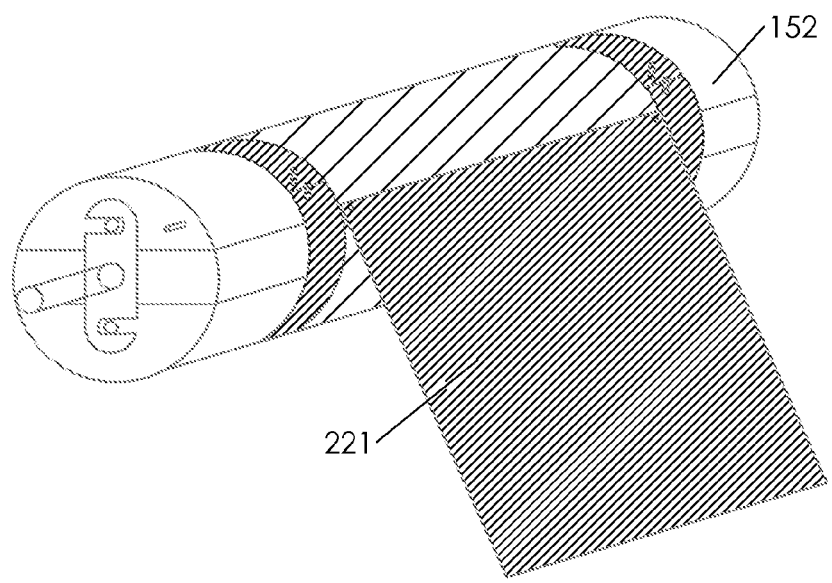
FIG. 17B is a pedagogical illustration of a third dielectric laminate layer being wrapped over the ply layer.

In FIG. 17B, a third dielectric layer 221 is wrapped over the ply layer 219.

The copper conductive layer 200, which is the inner most layer, can be left in a predominantly un-removed or unetched state to serve as the structural foundation of other layers to be built upon.

Figure 18:
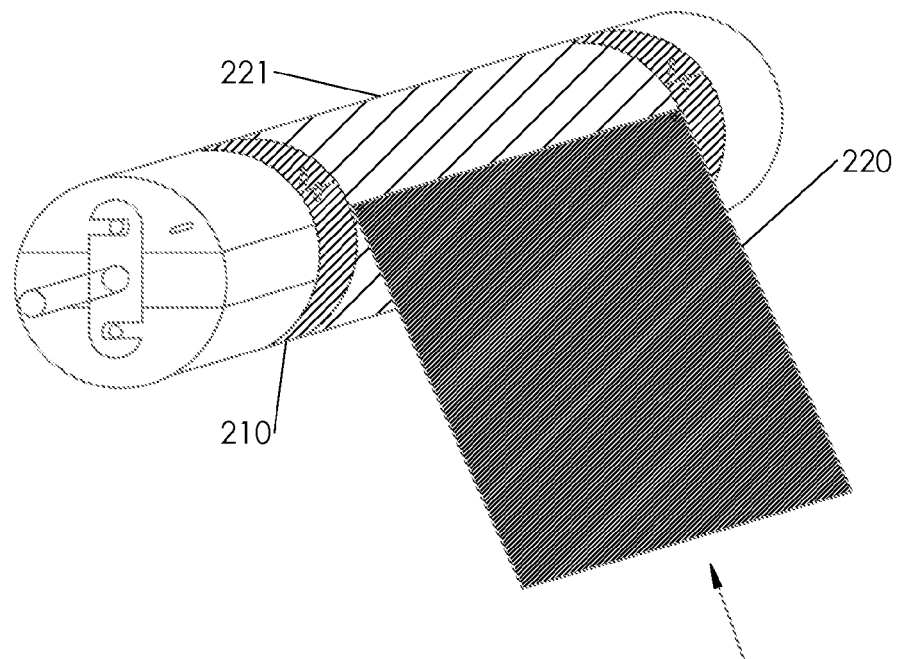
FIG. 18 is a pedagogical illustration of a third conductive layer being wrapped around the third dielectric layer in accordance with the teachings of the present invention.

In FIG. 18, a third copper conductive layer 220 is wrapped around third dielectric laminate layer 221.

Figure 19:
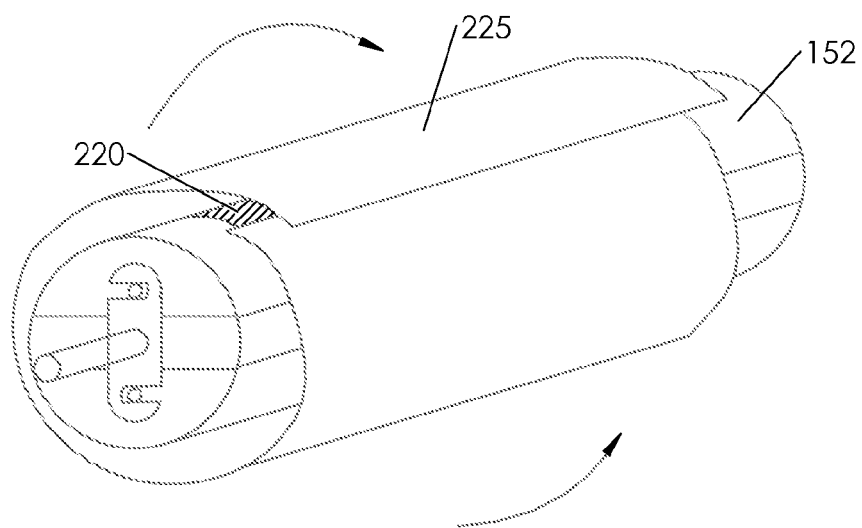
FIG. 19 is pedagogical illustration of a smoothing wrap or sheet metal wrap being wrapped around the third conductive layer prior to a lamination process for purposes of assembling a hollow PCB in accordance with the present invention.

In FIG. 19, a smoothing wrap tool 225 of stainless steel or other appropriate material is wrapped over the conductive layer 220 in preparation of another lamination process.

Figure 20:
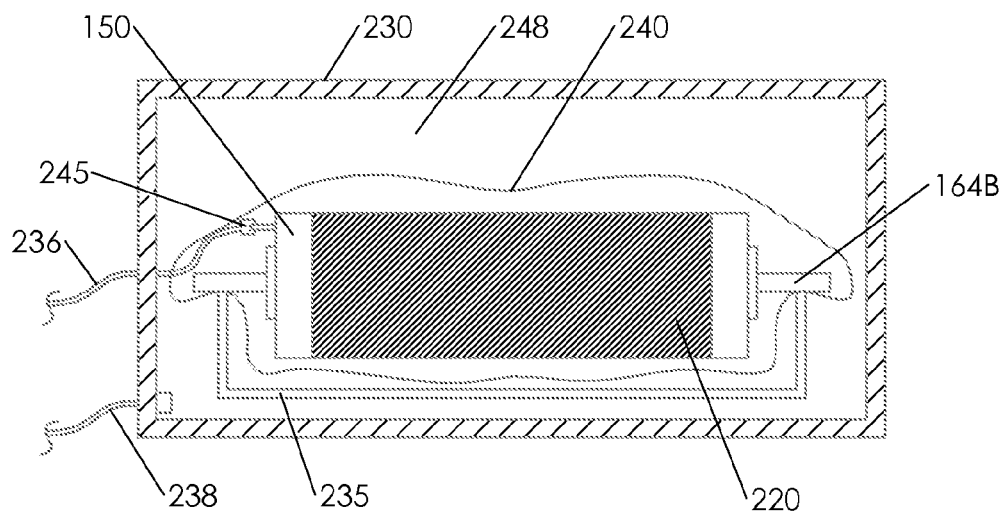
FIG. 20 is a X-ray side view of the mandrel inside a vacuum chamber for undergoing a second lamination process for purposes of assembling a hollow PCB in accordance with the present invention.

In FIG. 20, the lamination procedure described in regard to FIG. 10 is repeated.

Figure 21:
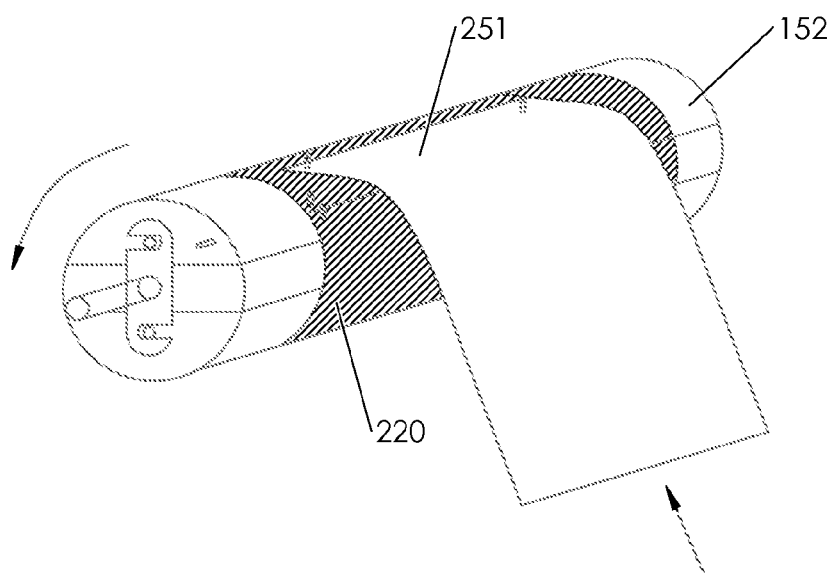
FIG. 21 is a pedagogical illustration of a second photo resist layer being wrapped around the third conductive layer after the lamination process shown in FIG. 20 in accordance with the present invention.

In FIG. 21, an etch resist layer 251 is wrapped around third copper conductive layer 220 in a repeat of the procedure shown in FIG. 11.

Figure 22:
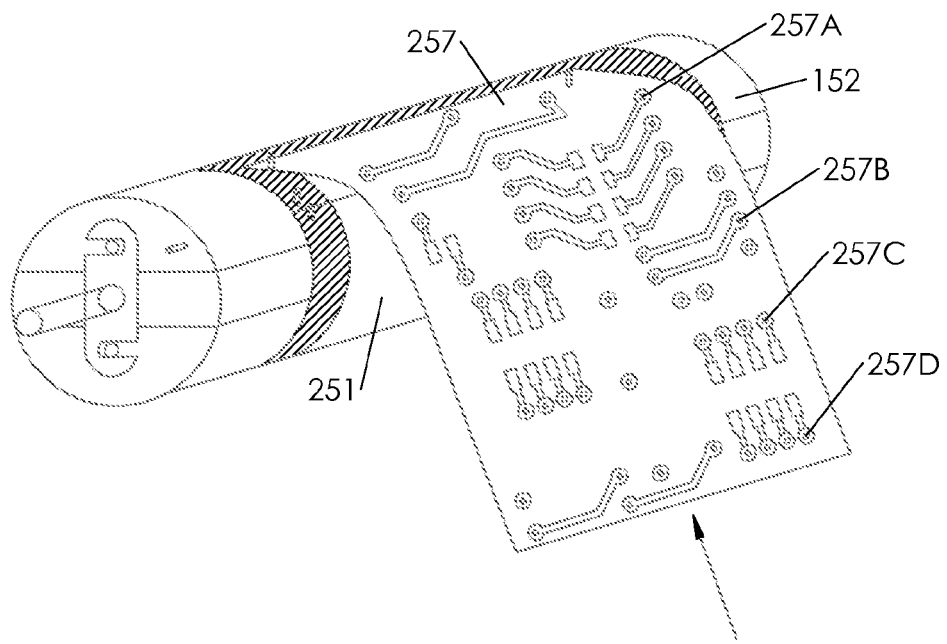
FIG. 22 is pedagogical illustration of a second artwork layer being wrapped over the second photo resist layer shown in FIG. 21 in accordance with the present invention.

In FIG. 22, an artwork or circuit design layer 257 having desired artwork, such as artwork or circuit design 257A, 257B, 257C, and 257D is wrapped onto the etchant resist layer 251 in a repeat of the procedure shown in FIG. 12.

Figure 23:
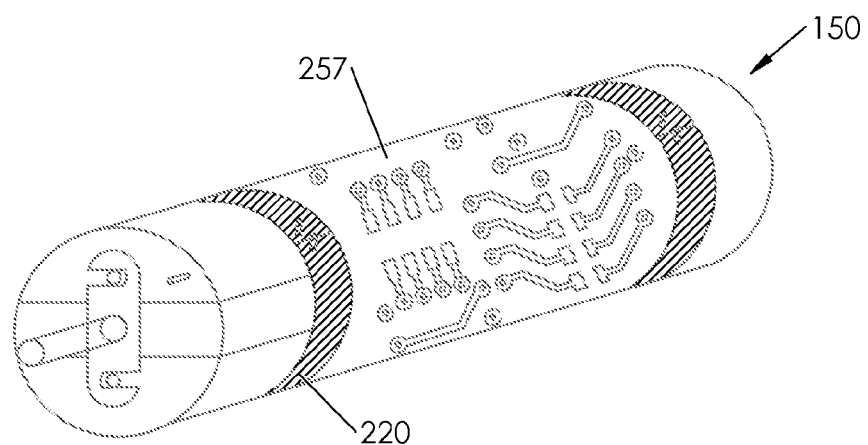
FIG. 23 is a pedagogical illustration of the second artwork layer being completely wrapped around the second photo resist layer in accordance with the present invention.

In FIG. 23, circuit design layer 257 is completely wrapped around the mandrel 150. The artwork layer 257 may need to be secured with one or more tooling pins to insure proper registration. Once the artwork layer 255 is in place and registered, the etchant resist 251 is exposed and cured by UV light source 270.

Figure 24:
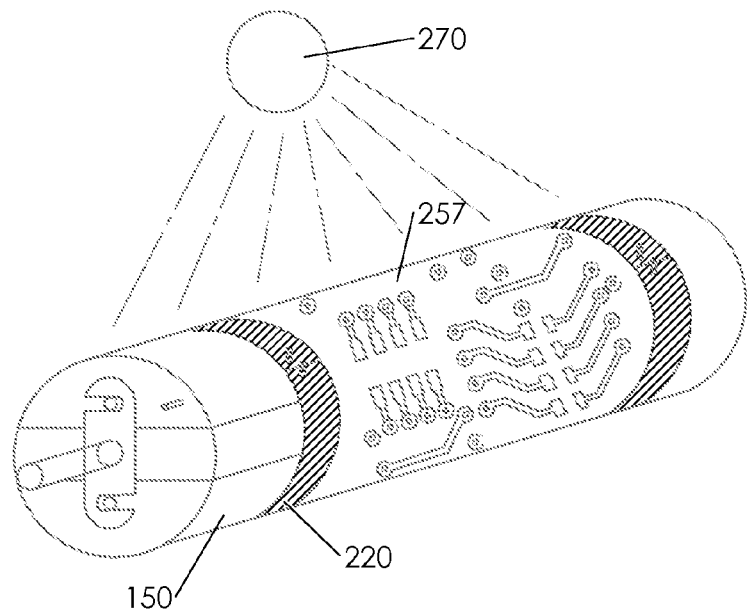
FIG. 24 is a pedagogical illustration of a UV light source traveling through the art work layer to expose and cure the second photo resist layer of FIG. 21.

In FIG. 24, the light rays of UV source 270 travel through the circuit design layer 257 to expose and cure the etchant resist 251. The artwork layer can be, for example, a milar sheet having the art or circuit patterns therein.

Figure 25A:
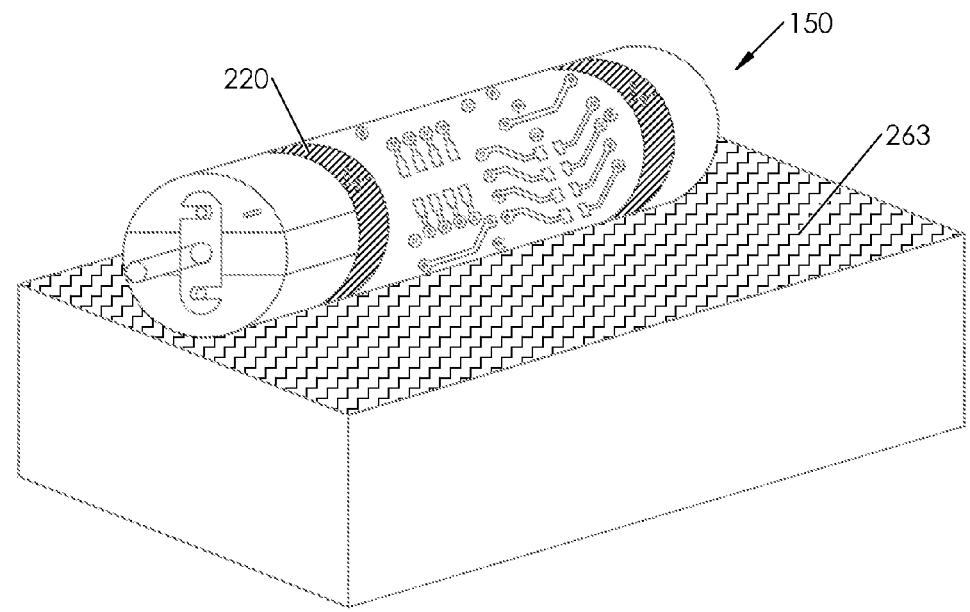
FIG. 25A is a pedagogical illustration of a non-planar PCB in accordance with the present invention undergoing a copper etching bath.
Figure 25:
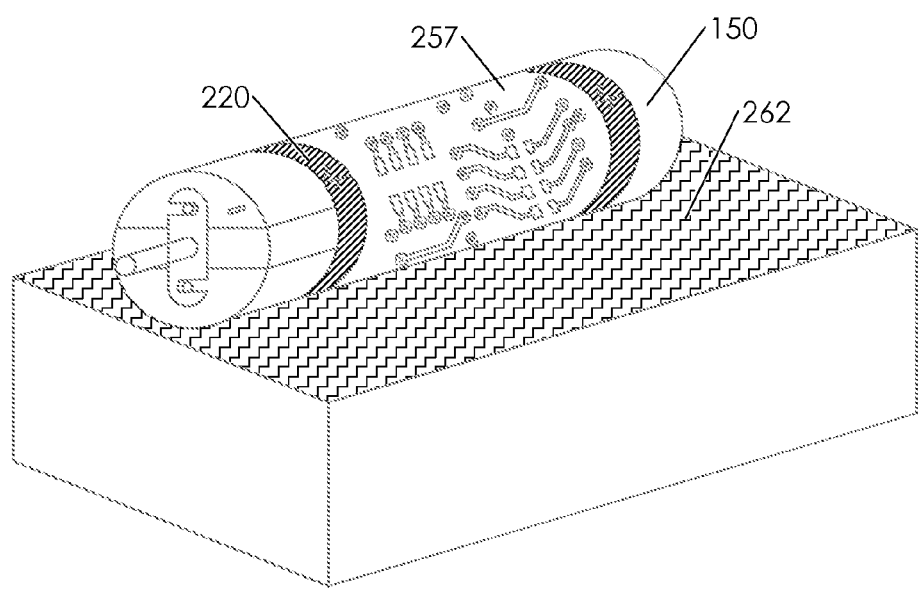
FIG. 25 is a pedagogical illustration of a development bath for removing the uncured area on the second photo resist layer in assembling a hollow PCB in accordance with the present invention.

In FIG. 25, the development bath 262 chemically removes the uncured area of the etchant resist 251 such that the exposed copper that does not have cured resist is removed.

In FIG. 25A, the mandrel 150 and the non-planar PCB structure on the mandrel is submerged into chemical etching bath 263 which, along with associated processing, removes the exposed or un-masked copper of copper layer 220.

Figure 26:
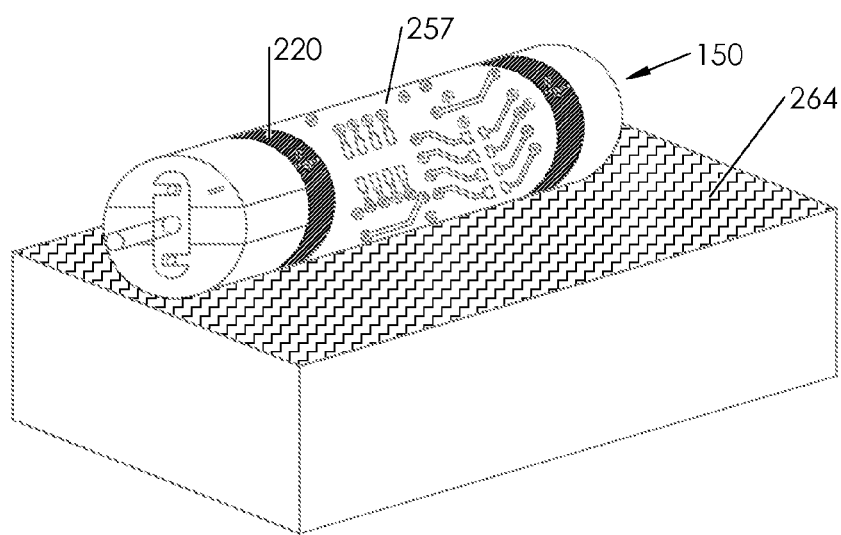
FIG. 26 is a pedagogical illustration of a chemical strip bath that removes cured resist on top of the second conductive layer in regions that were not etched so as to leave a circuit pattern.

In FIG. 26, the chemical strip bath 264 removes the cured resist on top of the third copper layer 220 regions that were not etched so as to leave a circuit pattern.

Figure 27:
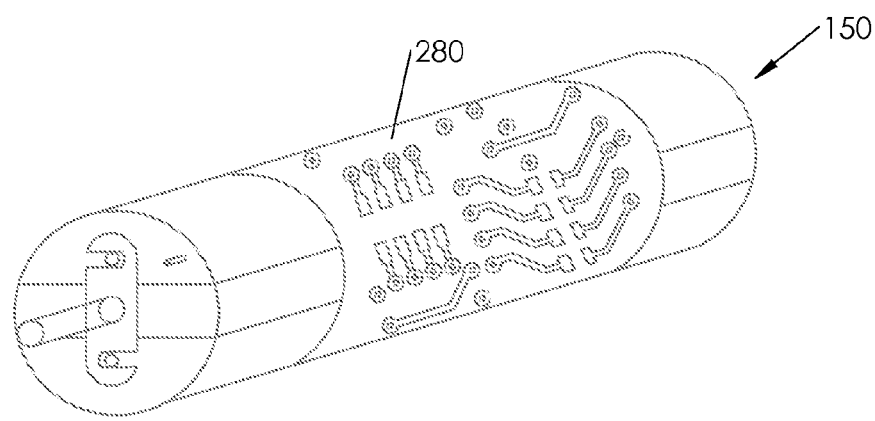
FIG. 27 is pedagogical illustration of the mandrel and assembled parts after the strip bath of FIG. 26 with excess copper removed in accordance with the present invention.

In FIG. 27, after removal from the chemical bath, FIG. 27 shows a completed circuit pattern 280.

The previously described steps depicted in FIGS. 5-26 can be repeated as many times as necessary until all the desired layers have been fabricated for a desired non-planar PCB design.

Figure 28:
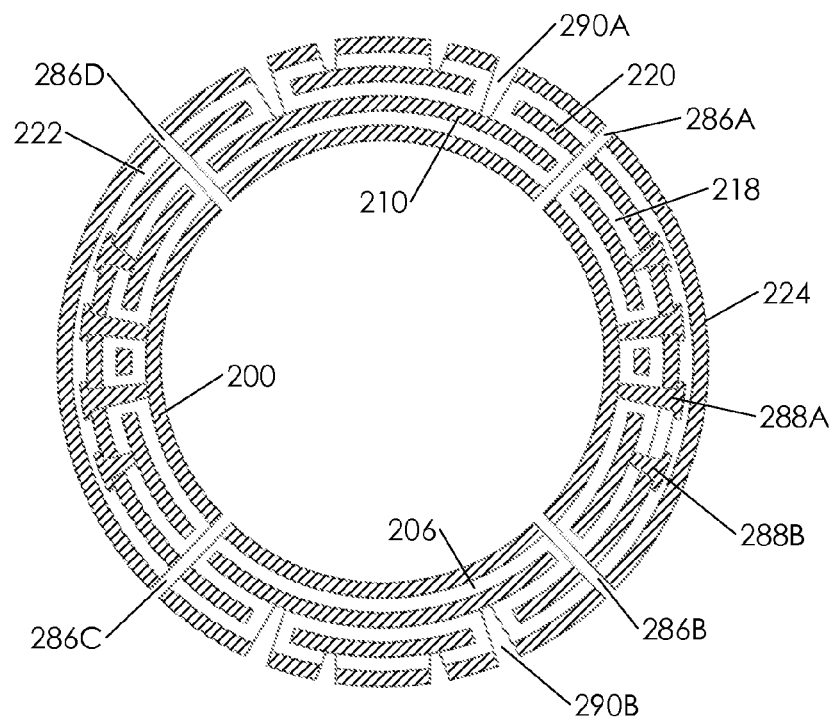
FIG. 28 is a cross sectional view of a hollow PCB in accordance with the present invention in which various conductive layers and dielectric layers are visible along with blind, buried and through vias.

In FIG. 28, a cross section of the cylindrical PCB according to the present invention reveals the first copper layer 200, the second copper layer 210, the third copper layer 220 and the fourth copper layer 224. Dielectric layers 206, 218 and 222 separate the copper conductive layers 220, 210, 220 and 224 from each other. Through vias 286A, 286B, 286C, and 286D separate the various conductive and dielectric layers into sections. Blind vias, such as vias 290A and 290B are shown to extend through the copper layers 224 and 220 and stop at conductive layer 210. Conductive connectors such as conductive connectors 288A and 288 B provide an electrical connection between third conductive layer 220 and second conductive layer 210.

Figure 29:
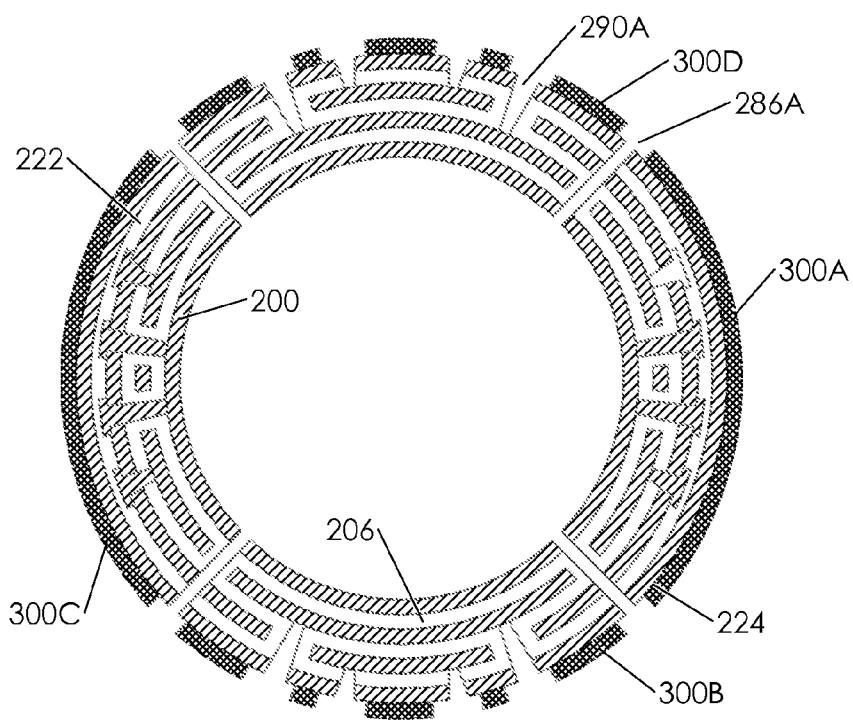
FIG. 29 is a cross sectional, pedagogical illustration of a hollow PCB in accordance with the present invention in which photo resist is applied to the most outside conductive layer.

In FIG. 29, the resist, such as resist 300A, 300B, 300C and 300D is applied to the outer copper foil layer 224 exposing only the areas where vias are to be plated.

Figure 30:
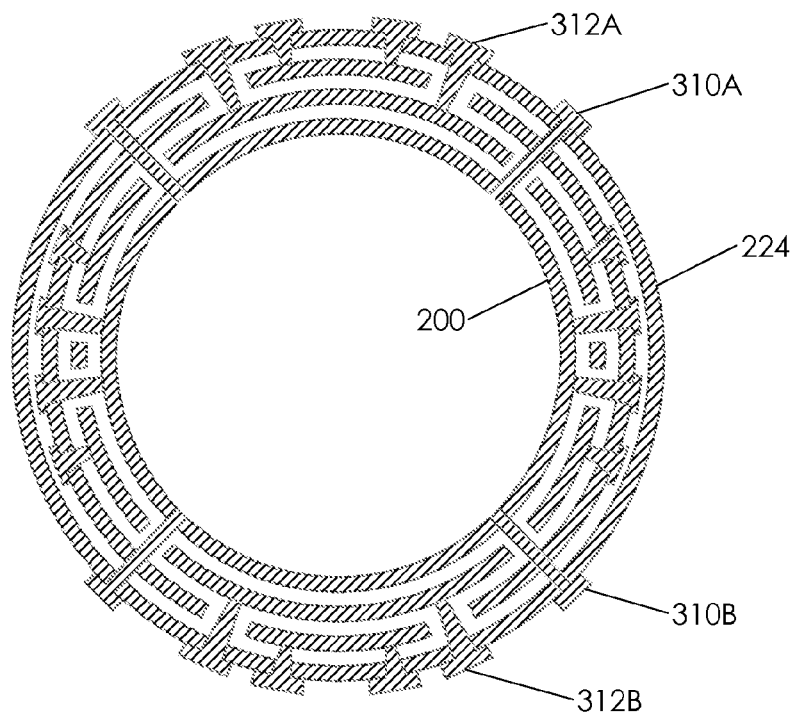
FIG. 30 is a cross sectional, pedagogical illustration of a hollow PCB in accordance with the present invention showing vias filling in blind, buried and through vias so as to appropriately connect the various conductive layers in desired locations.

In FIG. 30, plated connectors 310A, 310B, are shown to fill respective through vias and plated connectors 312A and 312B are shown to fill respective blind vias.

Figure 31:
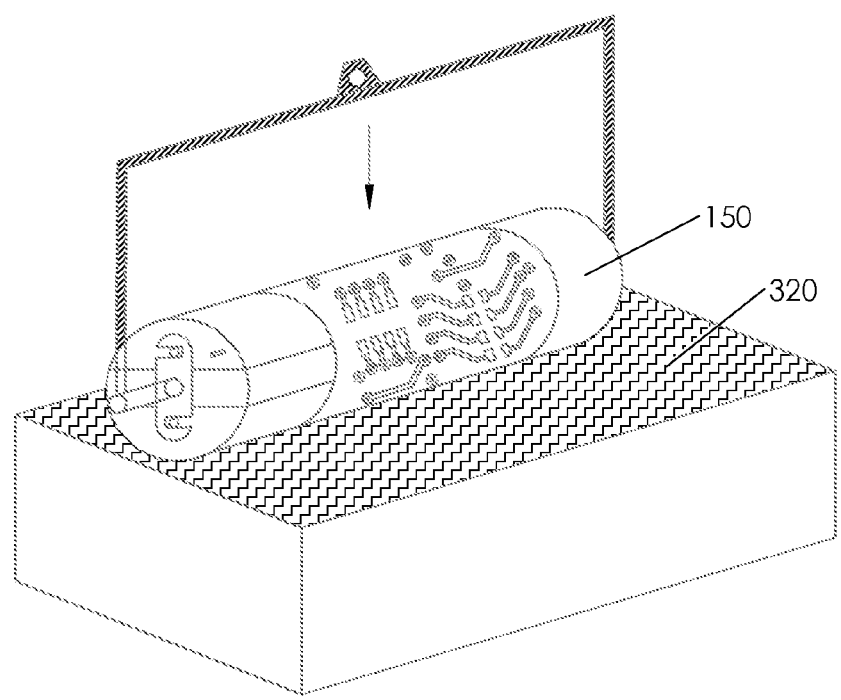
FIG. 31 is a pedagogical illustration of a plating bath in accordance with the present invention which allows copper plating to be formed on the non-planar PCB of the present invention.

In FIG. 31, a plating bath 320 demonstrates how plated connectors are formed by a copper plating or other appropriate process.

Figure 32:
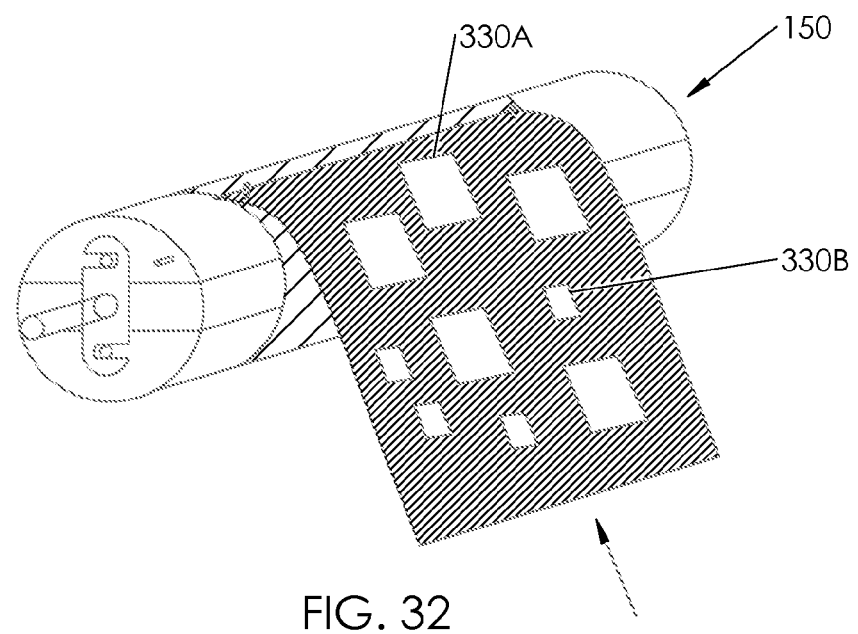
FIG. 32 is a pedagogical illustration showing cutout pockets or cavities in a given dielectric layer in accordance with the present invention.
Figure 33:
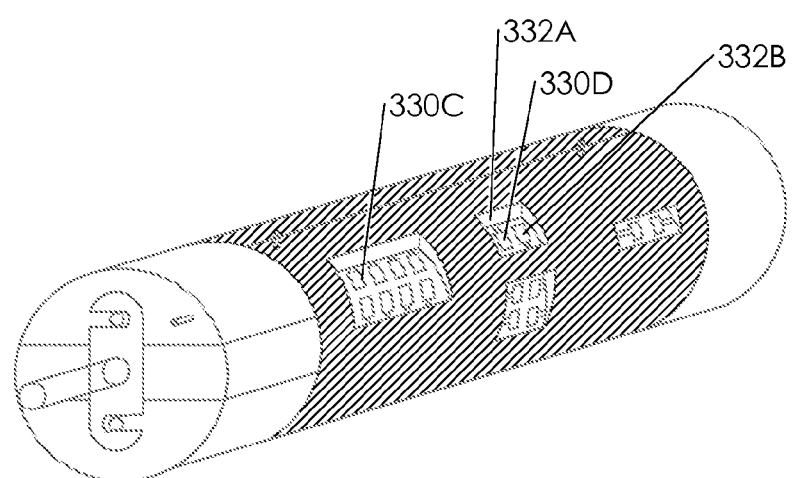
FIG. 33 is a pedagogical illustration of the cutout pockets of FIG. 32 containing electrical contacts in accordance with the present invention.

In FIGS. 32 and 33, cutout pockets 330A, 330B are cutout in a dielectric layer to accommodate electrical components.

Figure 34:
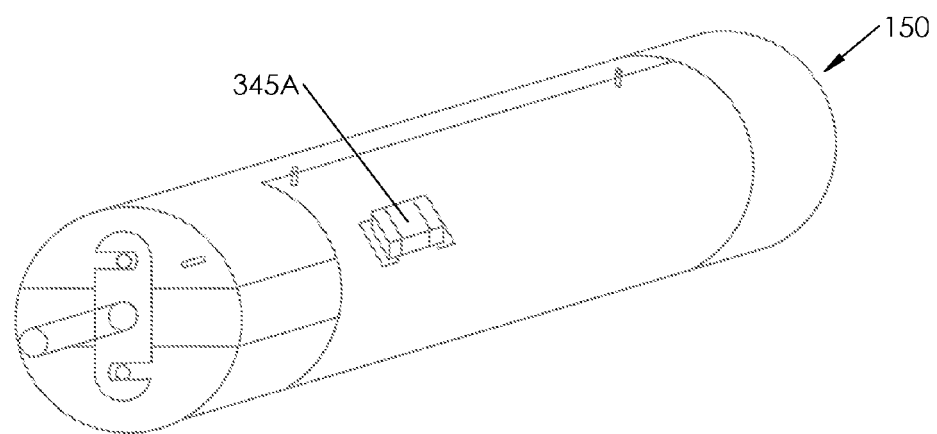
FIG. 34 is a pedagogical illustration showing how electrical components should be oriented lengthwise on a curved surface in accordance with the present invention.
Figure 35:
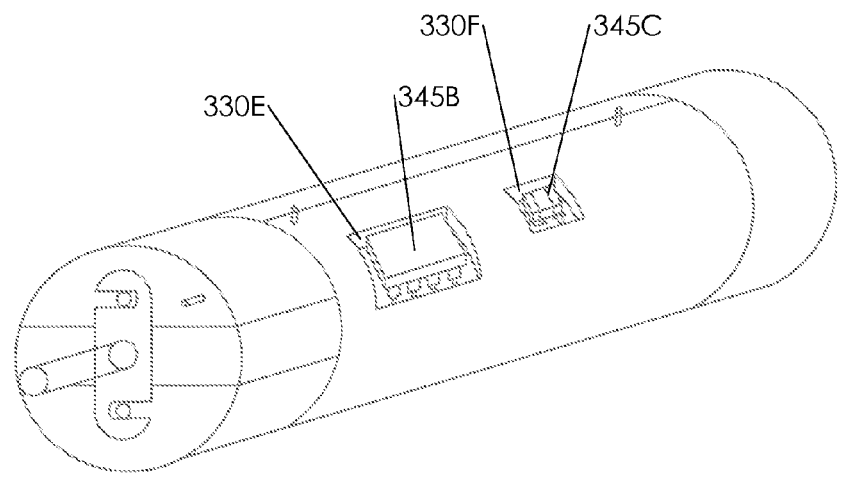
FIG. 35 is a pedagogical illustration showing an active and a passive device within cutout pockets of the PCB of the present invention.

FIGS. 34-35 demonstrates that electronic components 345A, 345B, 345C should be oriented lengthwise so as to reduce the radial angle at which the components connect to the cylindrical PCB.

Figure 36:
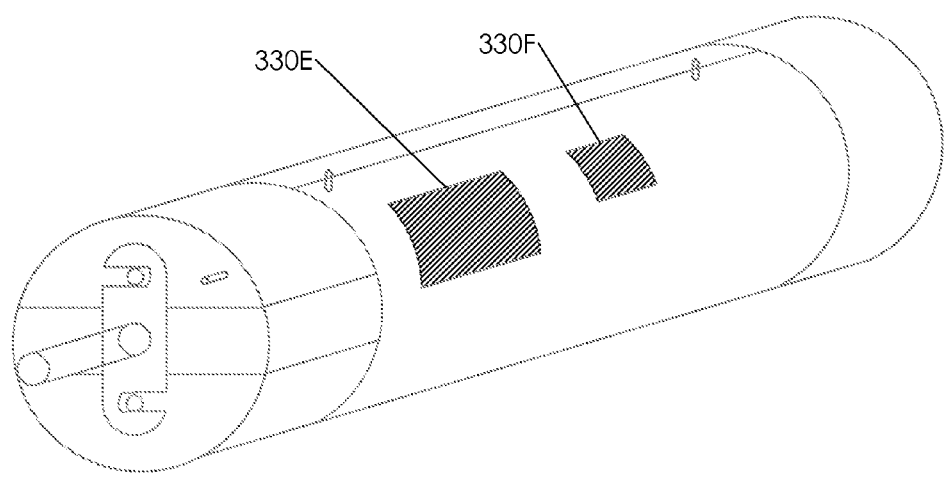
FIG. 36 is a pedagogical illustration of the cutout pockets demonstrated in FIG. 35 being filled in with epoxy.

In FIG. 36, the cutout pockets 330E and 330F are filled in with an epoxy of suitable coefficient.

Figure 37:
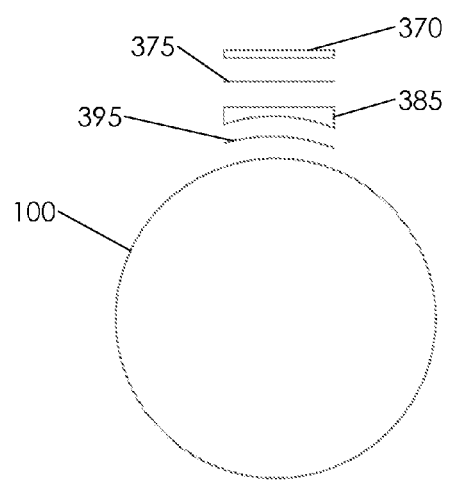
FIG. 37 is a pedagogical illustration showing how an electrical component having a flat underside can be assembled to a curved surface in accordance with the present invention.

In FIG. 37, a flat electrical component 370 is provided adapter elements 375, 385 and 395 for purposes of affixing the electrical component 370 to a curved surface such as the cylindrical surface of the PCB 100.

Figure 38:
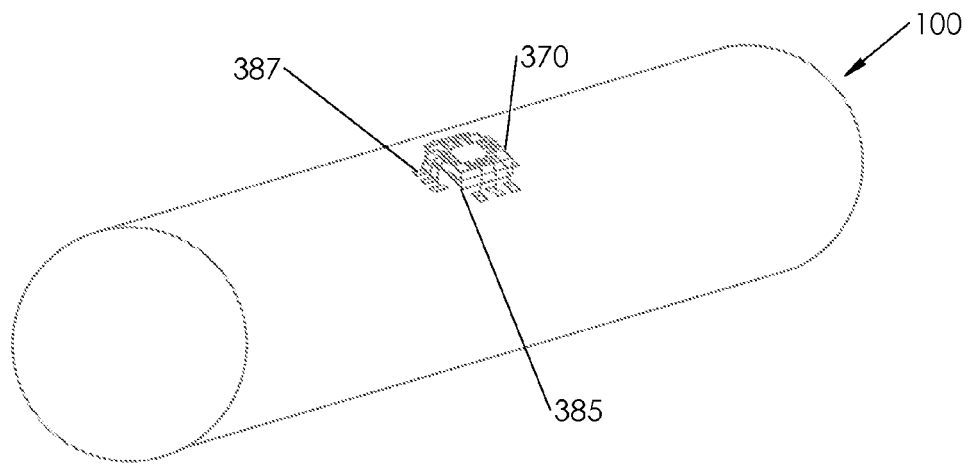
FIG. 38 is pedagogical illustration of an electrical component on the surface of the PCB, in accordance with the present invention, showing attachment with a wire bond.

In FIG. 38 it is demonstrated that the flat electrical component 370 and adapter element 385 can be affixed to the curved surface of non-planar PCB 100, with electrical connections 287 extending through the surface.

Figure 39:
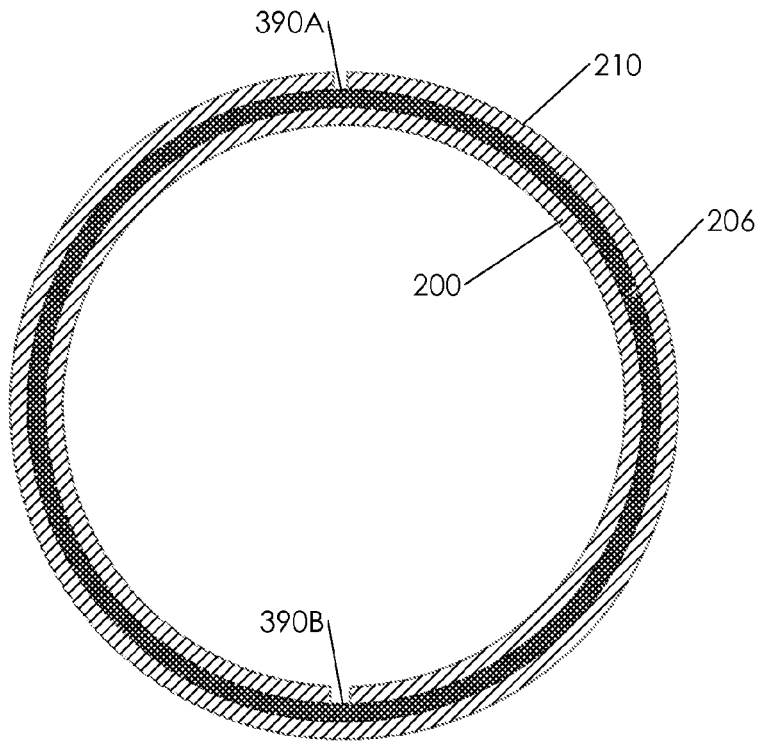
FIG. 39 is a cross-sectional, pedagogical illustration in accordance with the present invention showing seams in respective inner and outer conductive layers.

The cross-sectional view of FIG. 39 shows seams 390A and 390B in respective inner and outer conductive layers.

Figure 40:
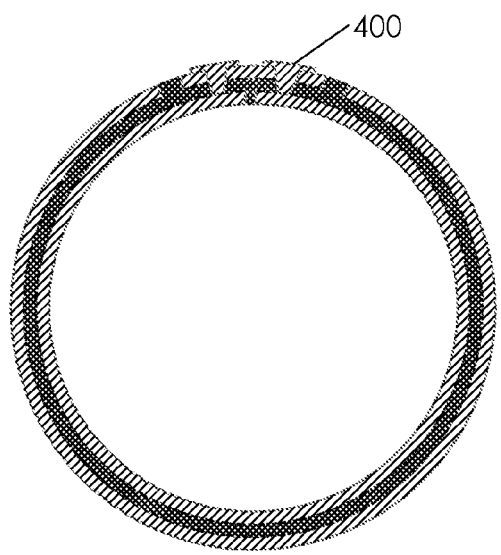
FIG. 40 is a cross sectional, pedagogical illustration demonstrating drilled and plated vias connecting two conductive layers.

In FIG. 40, the cross sectional view demonstrates a drilled and plated via 400.

Figure 41:
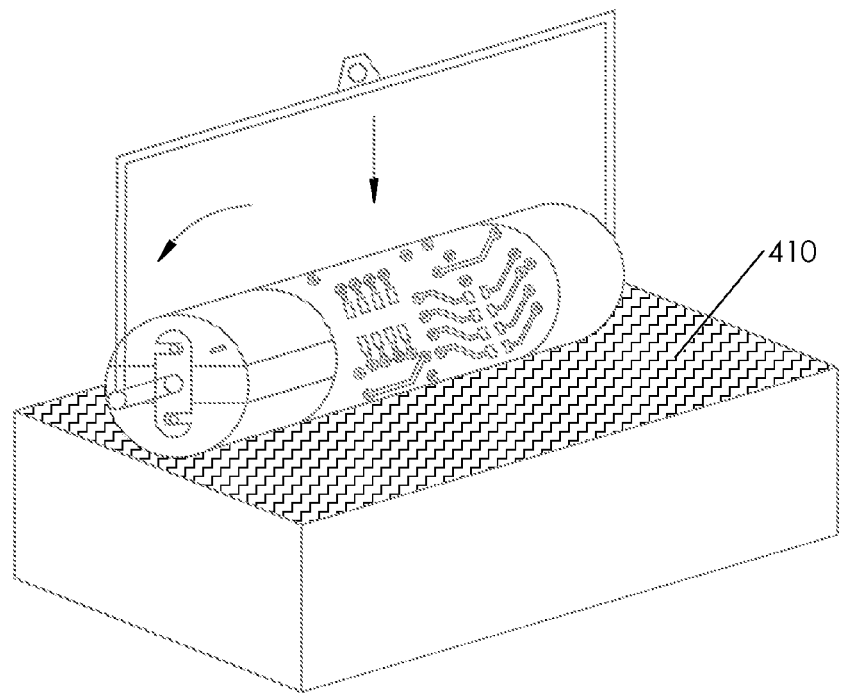
FIG. 41 is a pedagogical illustration of a plating bath for use in providing a final outer surface of the PCB in accordance with the present invention.

In FIG. 41, a plating bath 410 may be used to provide a final outer surface for the PCB 100.

Figure 42:
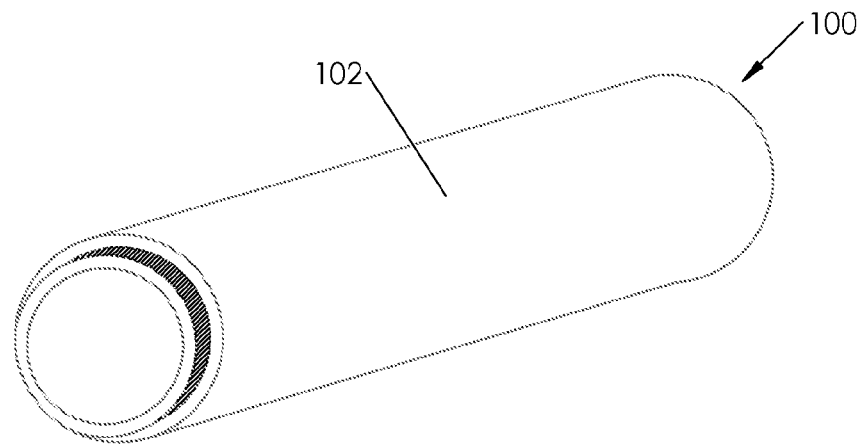
FIG. 42 is a perspective view of a cylindrical PCB in accordance with the present invention and demonstrates the outer surface and hollow center region of the PCB.
Figure 43:
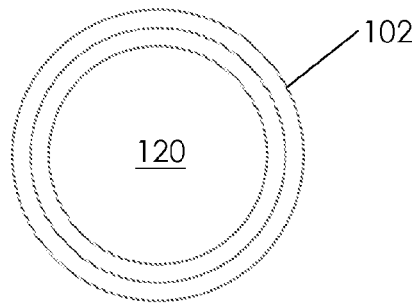
FIG. 43 is a front or rear view of a cylindrical PCB in accordance with the present invention.

In FIG. 42, the perspective view of a cylindrical PCB 100 according to the present invention demonstrates the outer surface 102 and the hollow center region 120. In FIG. 43, the front or rear view shows the hollow center region 120 to the radial interior of the outer surface 102.

Figure 44:
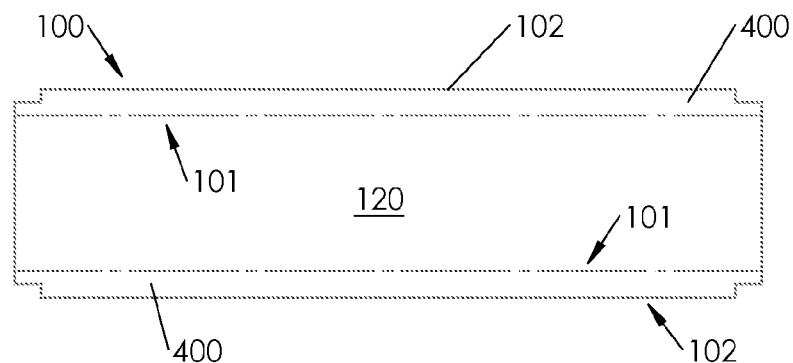
FIG. 44 is an X-ray side view of a cylindrical PCB in accordance with the present invention showing a hollow center region which is defined by an inner peripheral edge.

In FIG. 44, a multiple layered region 400 of the cylindrical PCB of the present invention includes conductive and dielectric layers such as conductive layers 200, 210 and 220 and dielectric layers 206, 218 and ply layer 219. Multiple layered region 400 has an outer surface 102 and an interior surface 101, with the various conductive, dielectric layers and ply layers, lying between the outer surface 102 and interior surface and 101. The interior surface 101 defines a border for the hollow center region 120.

FIGS. 45 through 49 are flows charts in which the steps for creating a hollow PCB according to the present invention are recited.

Figure 45:
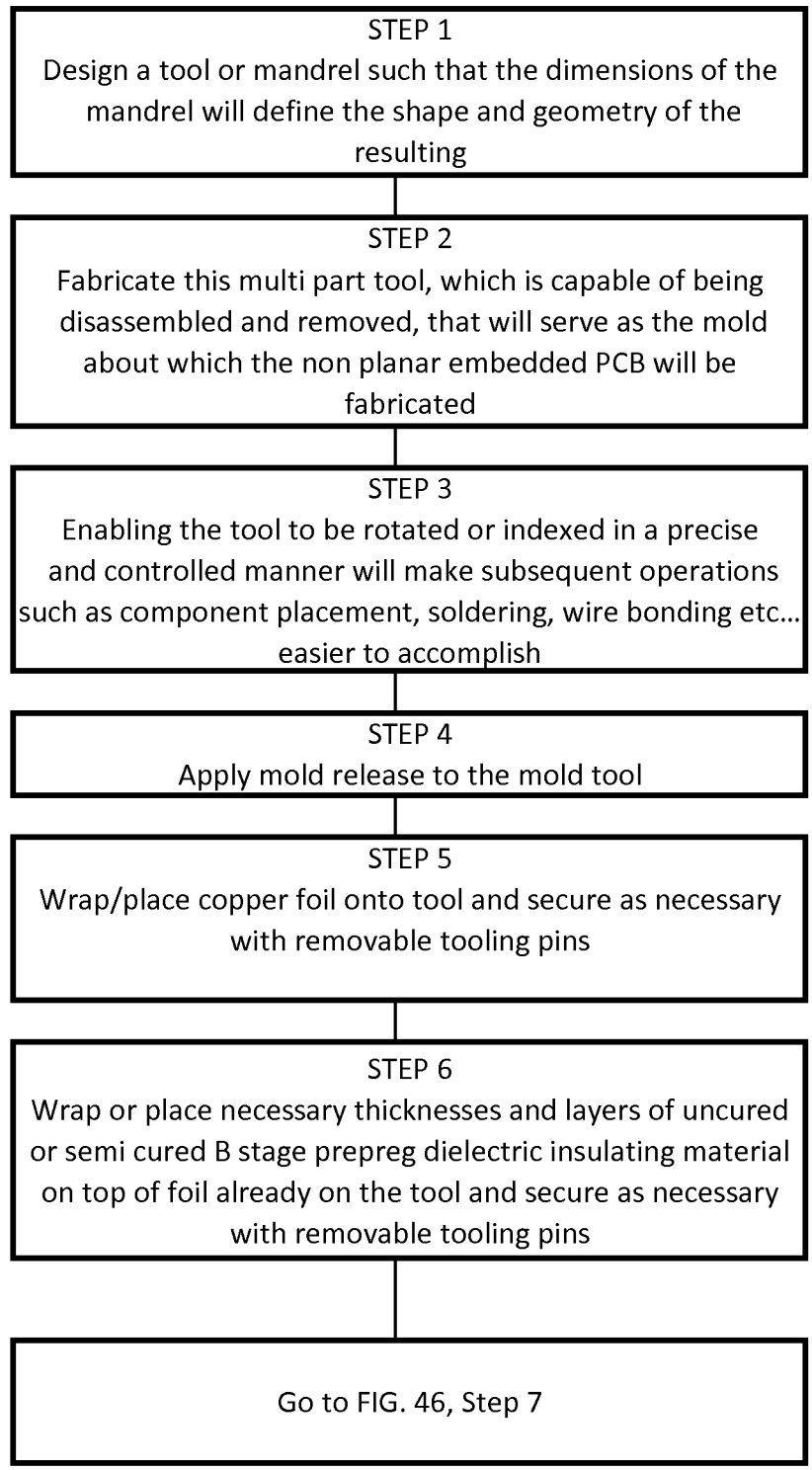

With reference to FIG. 45, in step 1, a tool or mandrel is required which is designed so the created PCB will have the desired dimensions and shape. In step 2, the designed mandrel is fabricated as a multi-part tool which is capable of being disassembled. The designed mandrel serves as the mold upon which the hollow or non-planar PCB will be fabricated. In step 3, the mandrel must be designed so that it can be rotated or indexed in a precise and controlled manner so as to allow for the various fabrication steps.

In step 4, the assembled mandrel has mold release applied so as to enable easier removal of the hollow PCB after the fabrication process is completed. In step 5, an initial copper foil or layer of conductive material is wrapped on to the mandrel and secured by pins. In step 6, necessary layers of dielectric laminate, such as semi-cured B stage pre-preg insulating material is wrapped over the initial copper foil layer and secured by pins.

Figure 46:
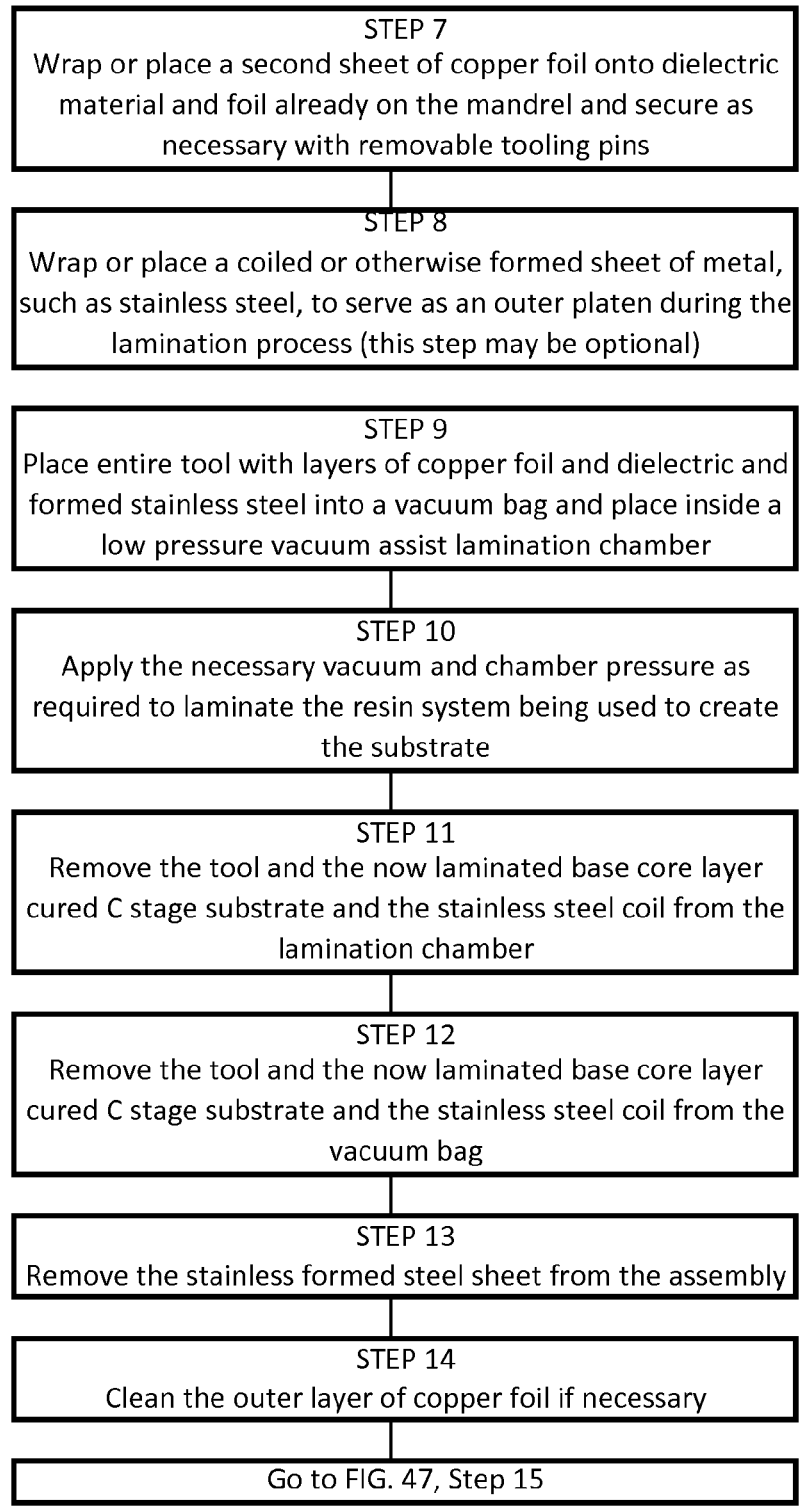

With reference to FIG. 46, in step 7, a second sheet of copper foil is wrapped over the initial dielectric layer and secured with pins. In step 8, a wrapping sheet of sheet metal or other appropriate material is wrapped over the initial copper foil layer, the initial dielectric layer and the second copper foil layer to serve as an outer platen during the lamination process so as to maintain the integrity and smoothness of the layers. In step 9, the mandrel with the metal wrapping sheet wrapped around aforementioned copper foil layers and dielectric layer is put in a vacuum bag and placed in a vacuum-assist lamination chamber.

In step 10, the necessary vacuum and chamber pressure is applied to laminate the copper foil layers by the resin material contained within the dielectric laminate layer.

In step 11, the mandrel is removed from the lamination chamber with the initial or base layer of copper now being laminated by cured C stage substrate. In step 12, the mandrel and with the base core layer of copper, the cured C stage substrate, and the stainless steel wrap are removed from the vacuum bag. In step 13, the stainless steel wrap is removed from the assembly. In step 14, the second layer of copper (outer layer) is cleaned if necessary.

With reference to FIG. 47, in step 15, the second layer of copper foil is coated with appropriate etch resist material. In step 16, milar artwork of circuit patterns is applied over the resist coated copper foil layer and secured by tooling pins. In step 17, UV light rays expose the entire assembly, but only curie, i.e., harden, the areas not masked by the art work.

In step 18, the artwork tool is removed. In step 19, The entire mandrel with its newly constructed layers is submerged in a development bath which removes the uncoated areas of copper foil. In step 20, the entire mandrel and newly constructed substrate layers are submerged in a chemical etching bath which removes the uncoated layers of copper. In step 21, the entire mandrel and the newly constructed substrates are placed in a stripping bath which removes the remaining cured coat resist from the remaining unetched copper foil.

Figure 48:
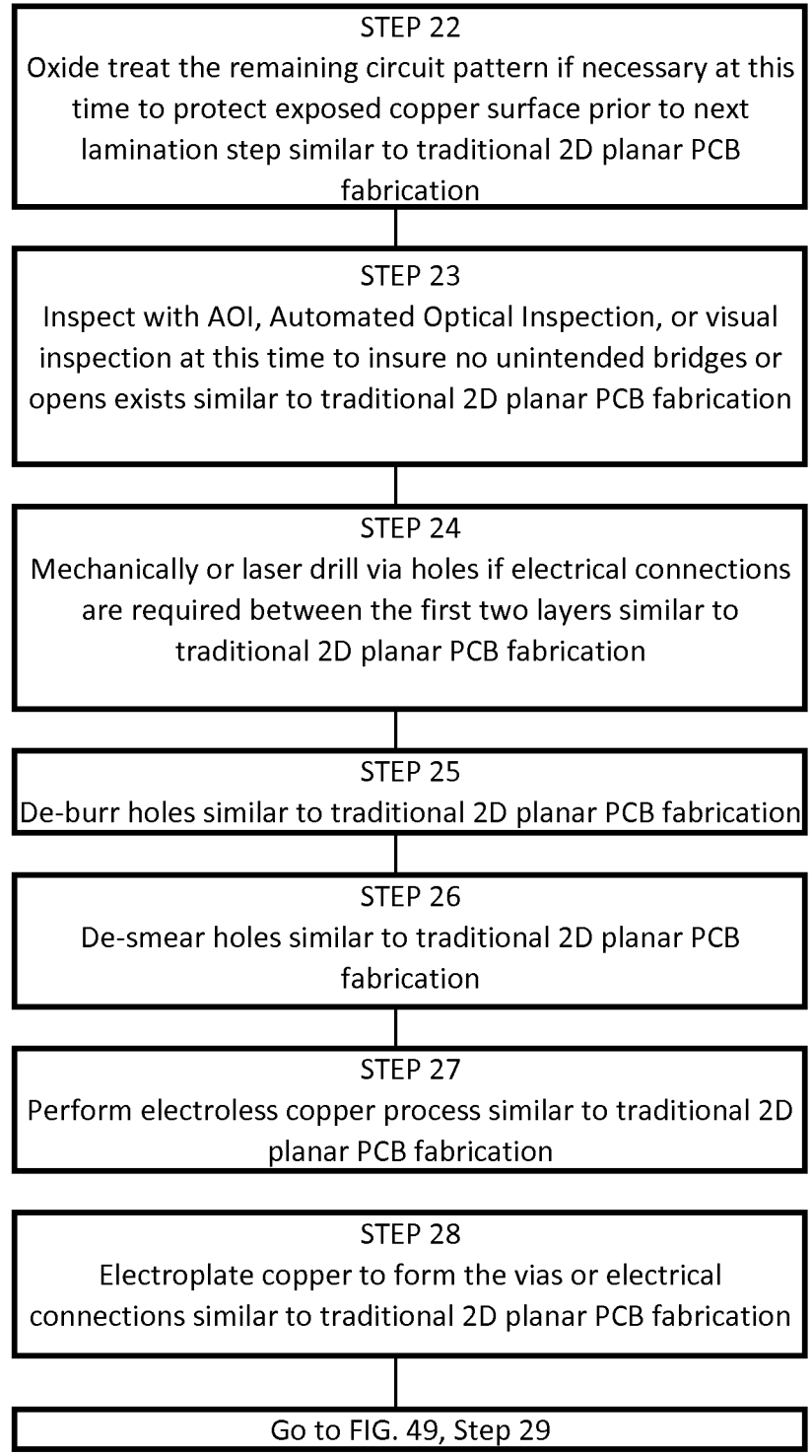

With reference to FIG. 48, in step 22, the remaining circuit pattern existing from the second layer of copper foil is oxide treated to protect the exposed copper prior to the next lamination step. In step 23, an automated optical inspection (AOI) is conducted or a visual inspection is conducted to make sure that no unintended bridges or openings exist.

In step 24, via holes are mechanically or laser drilled if electrical connections are required between the initial and second copper layers. In step 25, any fragments are removed from drilled holes by a deburring process. In step 26, resin residue is removed from holes in the respective copper layers by a desmearing process. In step 27, perform an electrolysis copper process. In step 28, electroplate copper to form electrical connections in selected vias.

Figure 49:
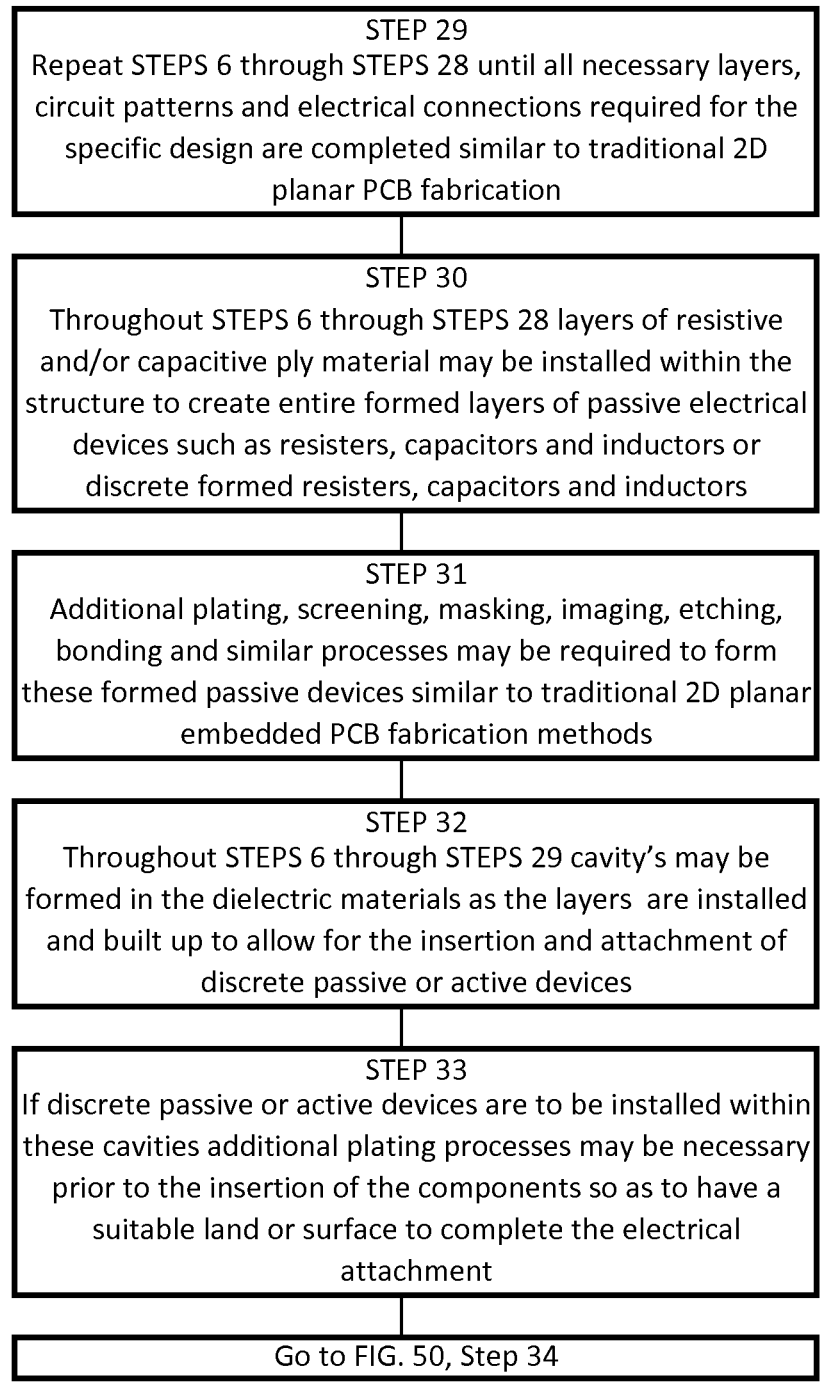

With reference to FIG. 49, in step 29, the above steps 6 through 28 are repeated until all necessary layers, circuit patterns and electrical connections required for a given, specific design are completed. In step 30, throughout steps 6 through 28, layers of resistive and/or capacitive ply material may be installed within the structure being assembled to create entire formed layers of passive electrical devices such as resistors, capacitors, inductors or discretely formed resistors, capacitors and inductors.

In step 31, additional plating, screening, masking, imaging, etching, bonding may be required to form the passive devices of step 30. In step 32, throughout steps 6 through 29, cavities may be formed in the dielectric materials as the layers are installed and built to allow for the insertion and attachment of discrete passive or active devices. In step 33, if discrete passive or active devices are to be installed within the cavities of step 32, additional plating processes may be necessary prior to the insertion of the components so as of have a suitable land surface to complete the electrical attachment.

Figure 50:
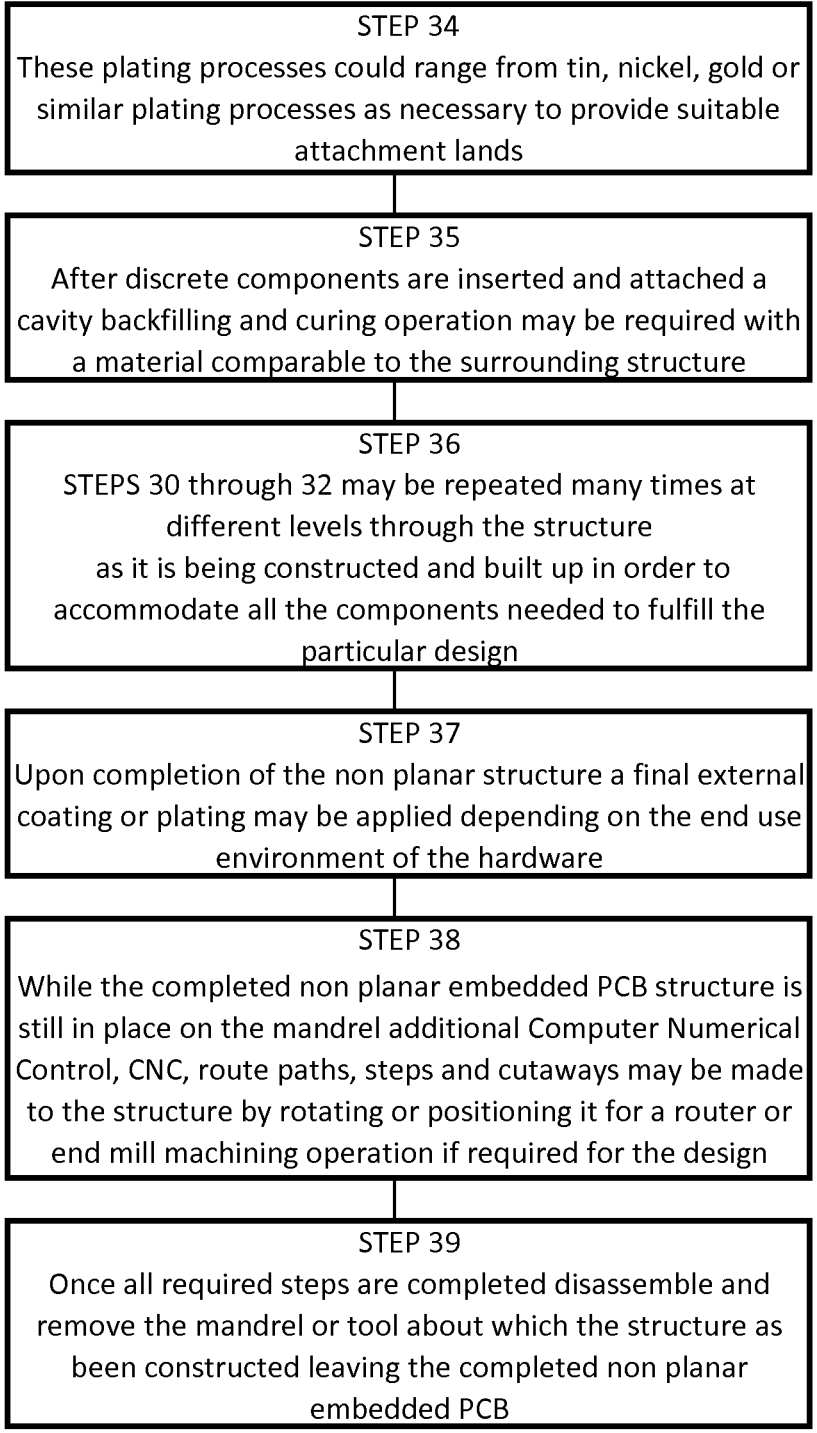

With reference to FIG. 50, in step 34, plating could occur, with the plating including tin, nickel, gold, or other appropriate plating for purposes of providing suitable attachment lands. In step 35, after discrete components are inserted in the cavities formed in step 32, a backfilling and curing operation may be necessary with a material similar to the surrounding structure of the given cavity.

In step 36, steps 30 through 32 may be repeated many times and at different levels through the structure as it is completed in order to accommodate all the components needed for a given design.

In step 37, upon completion of the non-planar, hollow PCB, a final external coating or plating may be applied depending on the intended use of the PCB. In step 38, while the completed, hollow, non-planar PCB structure is still in place on the mandrel, additional Computer Numerical Control (CNC), route paths, steps, and cutaways may be made to the structure by rotating or positioning the structure for a router or end mill machining operation as required. In step 39, once all steps are completed, the mandrel is disassembled and removed, leaving the completed hollow PCB.

Figure 51:
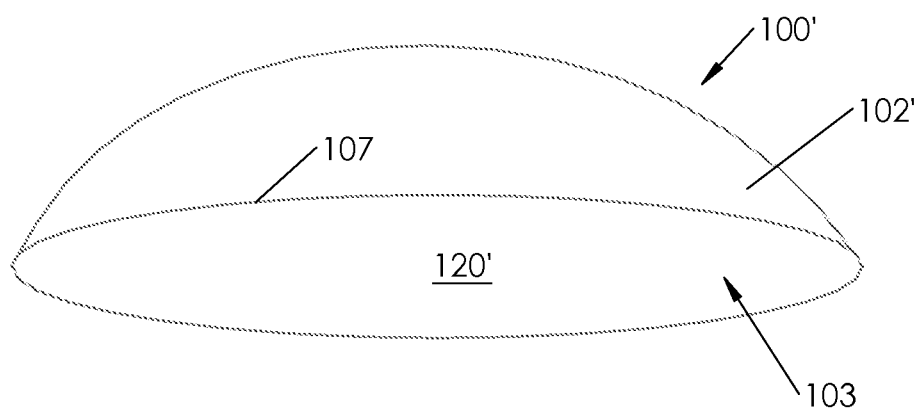
FIG. 51 is a perspective view of a bowl-shaped PCB in accordance with the present invention.

In FIG. 51, a bowl-shaped or half spherical PCB 100' in accordance with the teachings of the present invention has a concave shape with an opening 103 defined by a lower circumferential border 107 leading to an enclosed hollow area. The concave PCB can be created with a solid bowl shaped mandrel provided with grooves surrounding the lower periphery of the mandrel to enable routing of the various layers assembled on the mandrel so as to form the circumferential border or edge 107. During manufacture of the concave PCB various conductive and dielectric layers are formed as has been heretofore described for the cylindrical PCB of the present invention.

The present invention allows electrical components to be embedded in cylindrical structures or in other more complex geometries.

Although the present invention could be applied to many fields, the present invention has particular application to missile and/or rocket hardware. Traditional missiles systems are typically constructed of a tubular metallic fuselage or air frame that consists of multiple sections containing various components of the missile. These multiple sections can include the motor section, the controller section, the warhead section, the electronics section, and the seeker. The electrical components typically housed in the electronics section of a missile are attached or mounted to planar PCB's located in bulky card guide racks.

The present invention allows the geometry of a PCB to serve as the equipment enclosure thereby freeing space for other purposes and/or reducing the necessary weight and volume of a system or component.

In certain applications a PCB outer substrate according to the present invention may be capable of serving as a structural component such as for an air frame or fuselage thus eliminating the need for dedicated electronics sections and the attendant metal support structures of such typical sections.

In order to utilize a non-planar PCB substrate of the present invention as an airframe, some degree of reinforcement or structural ribbing may be required within the PCB substrate itself. However, this is easily accomplished by adding structural material where necessary to the PCB material.

Additionally, in applications where, for example, a cylindrical substrate is inappropriate to serve as a structural component or an actual missile fuselage, the cylindrical substrate can be used as an embedded member for freeing up significant internal volume within the missile for additional enhancements or purposes.

The present invention allows for any number of conductive and dielectric layers, with or without a ply layer or layers, to be utilized in a curved, hollow structure.

Various modifications are possible without deviating from the spirit of the present invention. Accordingly the scope of the invention is limited only by the claim language which follows hereafter.

What is claimed is:

1. A circuit board having embedded electronic components, comprising:
   a multiple layered region having at least one conductive layer and at least one dielectric layer, said multiple layered region having an outer surface and an interior surface;
   an empty space defined by said interior surface of said multiple layered region, said empty space being continuously surrounded by said interior surface; and
   at least one electrical component connected to said at least one conductive layer, said at least one electrical component being embedded in a non-planar layer of said multiple layered region such that said at least one electrical component is positioned between said outer surface and said interior surface, with said outer surface and said interior surface being non-planar.

2. A circuit board having embedded electronic components according to claim 1,
   wherein:
   said interior surface is a conductive surface.

3. A circuit board having embedded electronic components according to claim 2, wherein:
   said multiple layered region includes a ply layer.

4. A hollow circuit board having embedded electronic components according to claim 3,
   wherein:
   the circuit board is cylindrical.

5. A circuit board having embedded electronic components according to claim 3, wherein:
   an active electrical component rests on a dielectric layer located between said outer surface and said interior surface, said active electrical component being connected to said at least one conductive layer.

6. A circuit board having embedded electronic components according to claim 1, wherein:
   a frontal view of the non-planar circuit board reveals a geometric shape.

7. A circuit board having embedded electronic components according to claim 6, wherein:
   a rear view of the non-planar circuit board reveals said geometric shape.

8. A circuit board having embedded electronic components according to claim 7,
   wherein:
   said geometric shape is a circle.

9. A circuit board having embedded electronic components according to claim 1,
   wherein:
   said interior surface radially surrounds said empty space, with said empty space being visible in both frontal and rear views of the circuit board, with side views of the circuit board revealing a solid object.

10. A circuit board having embedded electronic components according to claim 1, wherein:
    in addition to said at least one conductive layer, a second conductive layer is located between said outer surface and said interior surface, with regions of circuit patterns being located between said outer surface and said interior surface; and
    in addition to said at least one dielectric layer, a second dielectric layer is located between said outer surface and said interior surface, with a ply layer being positioned between said second dielectric layer and said at least one dielectric layer, with a plurality of passive electrical components being positioned between said outer surface and said interior surface and a plurality of active electrical components being positioned between said outer surface and said interior surface, said plurality of passive electrical components and said plurality of active components being selectively connected to said regions of circuit patterns, at least one passive electrical component of said plurality of passive electrical components resting upon said ply layer and at least one active electrical component of said plurality of active electrical components resting upon said second dielectric layer, said ply layer and said second dielectric layer being non-planar curved layers.

11. A circuit board having embedded electronic components, comprising:
    a first layer, said first layer defining an enclosed periphery of an empty space, said first layer continuously surrounding said empty space, said empty space extending the entire longitudinal length of the circuit board;
    a second layer, said second layer having a different material composition than said first layer, said second layer directly connecting to said first layer and extending in sections so as to continually surround said first layer;
    a third layer connecting to said second layer, said third layer having a different material composition than said second layer and extending in sections so as to continually surround said second layer;
    a fourth layer connecting to said third layer, said fourth layer having a different material composition than said third layer and extending in sections so as to continually surround said third layer;

a fifth layer connected to said fourth layer, said fifth layer having a different material composition than said fourth layer and extending in sections so as to continuously surround said fourth layer;

at least one electrical connector extending into said first layer, into said second layer, into said third layer, into said fourth layer and into said fifth layer, and wherein a plurality of active electrical components and a plurality of passive electrical components are embedded between said first layer and said fifth layer, said plurality of active electrical components and said plurality of passive electrical components being electrically connected to said first layer, with the empty space being visible from a frontal view of the circuit board.

12. A circuit board having embedded electronic components according to claim 11, wherein:

said first layer is a conductive layer, said second layer is a dielectric layer, said third layer is a conductive layer, said fourth layer is a dielectric layer, and said fifth layer is a conductive layer.

13. A circuit board having embedded electronic components according to claim 11, wherein:

said first layer is a conductive layer, said second layer is a dielectric layer, said third layer is a ply layer and is positioned between said second layer and said fourth layer, said fourth layer being a dielectric layer.

14. A circuit board having embedded electronic components according to claim 11, wherein:

said empty space is visible from a rear view of the circuit board.

15. A circuit board having embedded electronic components according to claim 14, wherein:

side views of the circuit board reveal a solid object.

16. A circuit board having embedded electronic components according to claim 12, further comprising:

a sixth layer connected to said fifth layer, said sixth layer being a dielectric layer, said sixth layer extending in sections so as to continuously surround said fifth layer;

a seventh layer connected to said sixth layer, said seventh layer being a conductive layer, said seventh layer extending in sections to continuously surround said sixth layer; and a second electrical connector connecting said seventh layer and said fifth layer.

17. A circuit board having embedded electronic components according to claim 13, wherein:

said fifth layer is a conductive layer.

18. A circuit board having embedded electronic components according to claim 17, wherein:

a sixth layer connected to said fifth layer, said sixth layer being a dielectric layer, said sixth layer extending in sections to continuously surround said fifth layer;

a seventh layer connected to said sixth layer, said seventh layer being a ply layer, said seventh layer extending in sections to continuously surround said sixth layer;

an eighth layer connected to said seventh layer, said eighth layer being a dielectric layer, said eighth layer extending in sections to continuously surround said seventh layer;

a ninth layer connected to said eighth layer, said ninth layer being a conductive layer, said ninth layer extending in sections to continuously surround said eighth layer; and an electrical connector connecting said ninth layer and said fifth layer.

19. A circuit board having embedded electronic components according to claim 14, wherein:

said first layer, said second layer, said third layer, said fourth layer and said fifth layer are curved such that said plurality of active electrical components and said plurality of passive electrical components are positioned upon and between respective curved surfaces.

20. A circuit board having embedded electronic components according to claim 11, wherein:

the empty space is visible from a rear view of the circuit board with side views of the circuit board revealing a solid object.

* * * * *